(12) United States Patent
Nakajima et al.

(10) Patent No.: US 8,497,497 B2
(45) Date of Patent: Jul. 30, 2013

(54) ORGANIC ELECTROLUMINESCENT ELEMENT, METHOD FOR MANUFACTURING THE ORGANIC ELECTROLUMINESCENT ELEMENT, AND LIGHT EMITTING DISPLAY DEVICE

(75) Inventors: Hiroyoshi Nakajima, Nagareyama (JP); Masaya Shimogawara, Tsuchiura (JP); Yasuhiro Iizumi, Setagaya-Ku (JP)

(73) Assignee: Dai Nippon Printing Co., Ltd., Shinjuku-Ku (JP)

( * ) Notice: Subject to any disclaimer, the term of this patent is extended or adjusted under 35 U.S.C. 154(b) by 407 days.

(21) Appl. No.: 12/883,263

(22) Filed: Sep. 16, 2010

(65) Prior Publication Data

US 2011/0073846 A1    Mar. 31, 2011

(30) Foreign Application Priority Data

Sep. 28, 2009    (JP) .................................. 2009-222190

(51) Int. Cl.
*H01L 35/24*    (2006.01)

(52) U.S. Cl.
USPC ..................... 257/40; 257/E51.001

(58) Field of Classification Search
USPC ........................... 257/40, E51.001
See application file for complete search history.

(56) References Cited

U.S. PATENT DOCUMENTS

| 5,739,545 | A | 4/1998 | Guha et al. |
| 6,716,662 | B2 | 4/2004 | Akai |
| 7,012,364 | B2 | 3/2006 | Mori et al. |
| 7,687,987 | B2 | 3/2010 | Akai et al. |
| 2011/0031476 | A1* | 2/2011 | Oda et al. .................. 257/40 |

FOREIGN PATENT DOCUMENTS

| JP | 10-223377 | A1 | 8/1998 |
| JP | 2003-077651 | A1 | 3/2003 |
| JP | 2004-127740 | A1 | 4/2004 |
| JP | 2004-227943 | A1 | 8/2004 |
| JP | 2004-296234 | A1 | 10/2004 |
| JP | 2007-265792 | A1 | 10/2007 |

* cited by examiner

*Primary Examiner* — Anthony Ho
(74) *Attorney, Agent, or Firm* — Burr & Brown

(57) ABSTRACT

Disclosed is an organic electroluminescent element having an element structure that can reduce damage to an organic layer during electrode formation and can facilitate the injection of charges from the electrode into the organic layer. The organic electroluminescent element includes an anode, a cathode, and an organic layer held between the anode and the cathode. The organic layer contains a luminescent material. The organic electroluminescent element further includes a transparent protective layer provided between the anode or the cathode and the organic layer. The transparent protective layer contains a bipolar charge transport organic compound and an electron-accepting compound. The transparent protective layer is formed in a period between after the formation of the organic layer and before the formation of the anode or the cathode on the organic layer.

8 Claims, 9 Drawing Sheets

10A

10A

10B

ORGANIC ELECTROLUMINESCENT ELEMENT, METHOD FOR MANUFACTURING THE ORGANIC ELECTROLUMINESCENT ELEMENT, AND LIGHT EMITTING DISPLAY DEVICE

BACKGROUND OF THE INVENTION

1. Field of Invention

The present invention relates to an organic electroluminescent element, a method for manufacturing the organic electroluminescent element, and a light emitting display device using the organic electroluminescent element. More specifically, the present invention relates to an organic electroluminescent element having an element structure that can reduce damage to an organic layer during electrode formation and can facilitate the injection of charges from the electrode into the organic layer, and a method for manufacturing the organic electroluminescent element and a light emitting display device using the organic luminescent element.

2. Description of Related Art

An organic electroluminescent element, which comprises a luminescent material-containing organic luminescent layer held between a pair of electrodes and emits light by applying voltage across both the electrodes (hereinafter sometimes referred to as an organic EL element), has advantages such as high visibility by virtue of self-color development, high impact resistance due to the nature of a whole solid state element unlike liquid crystal elements, a high response speed, low susceptibility to temperature change, and a large view angle, and attention has been drawn to the utilization of the organic electroluminescent element as a luminescent element in display devices.

The organic EL element has a basic construction of a laminated structure of anode/organic luminescent layer/cathode. The organic EL element generally has hitherto been of a bottom emission type that is manufactured by stacking an anode formed of a transparent electroconductive film on a transparent base material such as a glass substrate and then stacking an organic luminescent layer and a cathode in that order and takes out light from the anode side.

In recent years, attention has been drawn to a top emission-type organic EL element that, in the above construction, uses a transparent electroconductive film in the cathode and takes out light from the cathode side. In the top emission-type organic EL element, since the cathode and the anode are formed of a transparent electroconductive film, a luminescent element which is transparent as a whole can be realized and, thus, both side emission can be realized. The transparent luminescent element is advantageous in that, since any desired color can be adopted as a background color, a display device which can be in a colored state even at a time other than during light emission can be provided and, thus, excellent decoration can be realized. Further, in the top emission-type organic EL element, since emitted light is not shielded by TFT (a thin-film transistor) which is an active drive element, a display device having a high opening ratio can be realized.

In the top emission-type organic EL element, an organic luminescent layer is generally provided between the anode and the cathode. Various forms of construction of the top emission-type organic EL element are possible. In one example of the construction, the cathode comprises an electron injection layer formed of aluminum (Al) or the like and a transparent electroconductive film formed of ITO (indium tin oxide) or the like, the electron injection layer being disposed on the organic luminescent layer side.

Since, however, the transparent electroconductive film formed of ITO or the like is generally formed by sputtering, in the organic EL element having the above construction, the formation of the transparent electroconductive film on the electron injection layer poses a problem of causing lowered luminescence characteristics as a result of damage to the organic luminescent layer or the electron injection layer due to impact of sputtered particles or argon ions ($Ar^+$), ionized electrons or the like during sputtering, for example, lowered current density, lowered luminescence efficiency, and the occurrence of leak current.

Further, the use of plasma in the formation of the transparent electroconductive film poses a problem of causing lowered luminescence characteristics as a result of undergoing the same damage as described above due to exposure of the organic luminescent layer or the electron injection layer to a plasma atmosphere.

Furthermore, in the formation of the transparent electroconductive film, problems occur including a problem of causing lowered electron injection properties as a result of oxidation of a highly reactive metal such as aluminum (Al) constituting the electron injection layer by oxygen in the atmosphere or oxygen released from a target, for example, lowered current density characteristics, lowered luminescence efficiency, and increased dark spots.

In order to solve the above problems, organic EL elements comprising various layers provided between the organic luminescent layer and the transparent electroconductive film (upper electrode) have been proposed. For example, Japanese Patent Application Laid-Open No. 77651/2003 proposes an organic EL element comprising a sputtered protective layer that is formed of gold, nickel, or aluminum and is provided between an organic luminescent layer and a transparent electroconductive film. Further, Japanese Patent Application Laid-Open No. 127740/2004 proposes an organic EL element comprising a cathode having a two-layer structure of a first cathode and a second cathode and an electron transport protective layer provided between the first cathode and the second cathode, the electron transport protective layer being formed of an electron transport organic material such as bathocuproine (BCP) doped with an alkali metal or an alkaline earth metal (for example, lithium (Li), cesium (Cs), barium (Ba), strontium (Sr), or calcium (Ca)). Further, Japanese Patent Application Laid-Open No. 223377/1998 proposes an organic EL element comprising a cathode formed of a thin metal film (a Ca film) and a protective film that covers the thin metal film and is formed of a semiconductor (for example, ZnSe) having a broad bandgap. Furthermore, Japanese Patent Application Laid-Open No. 227943/2004 proposes an organic EL element comprising a hole injection layer having a thickness of 30 nm to 1000 nm that is provided between an organic luminescent layer and a transparent electroconductive film (an upper anode). Furthermore, Japanese Patent Application Laid-Open No. 296234/2004 proposes an organic EL element comprising a buffer layer that is provided between an organic luminescent layer and a transparent electroconductive film (an upper electrode) and is formed of a phthalocyanine compound doped with a metal such as gold (Au), platinum (Pt) or silver (Ag). Furthermore, Japanese Patent Application Laid-Open No. 265792/2007 proposes an organic EL element that, in order to keep a balance between holes and electrons injected into an organic luminescent layer, comprises a laminate of semi-transparent cathode layer/transparent buffer layer/transparent electroconductive protective layer provided on the organic luminescent layer and has a contact region, provided in a non-display region, where the semi-transparent cathode layer is in contact with the transparent electroconductive protective layer, whereby current is allowed to flow through the semi-transparent cathode layer and the transparent electroconductive protective layer to efficiently supply electrons into the organic luminescent layer.

In the organic EL elements proposed in the above patent documents, various layers are inserted into between the organic luminescent layer and the transparent electroconductive film (upper electrode). In the top emission-type organic EL element, however, transparency is required of the layer to be inserted and, at the same time, electron transport properties and electron injection properties necessary for supplying charges into the organic luminescent layer should be satisfactorily high. In particular, unsatisfactory electron transport properties and electron injection properties pose a problem of causing a lowering in current-voltage characteristics due to an increase in electric resistance as the whole element and, at the same time, causing a lowering in luminescence characteristics due to loss of balance between holes and electrons injected into the organic luminescent layer.

Further, in the organic EL element proposed in Japanese Patent Application Laid-Open No. 265792/2007, in order to allow current to flow through the semi-transparent cathode layer, the thickness of the semi-transparent cathode layer should be large. This sometimes leads to lowered transparency of the element. Furthermore, since the semi-transparent cathode layer is formed of a highly reactive material such as an alkali metal as a simple substance, in the region where the semi-transparent cathode layer is in contact with the transparent electroconductive protective layer, the transparent electroconductive protective layer sometimes undergoes damage such as oxidation in the formation of the transparent electroconductive protective layer.

SUMMARY OF THE INVENTION

Accordingly, an object of the present invention is to provide an organic electroluminescent element having an element structure that can reduce damage to an organic layer during electrode formation and can facilitate the injection of charges from the electrode into the organic layer, and a method for manufacturing the organic electroluminescent element. Another object of the present invention is to provide a light emitting display device comprising the organic electroluminescent element.

According to the present invention, there is provided an organic electroluminescent element comprising: an anode; a cathode; and an organic layer held between the anode and the cathode, the organic layer containing a luminescent material, the organic electroluminescent element further comprising a transparent protective layer provided between the anode or the cathode and the organic layer, the transparent protective layer containing a bipolar charge transport organic compound and an electron-accepting compound.

According to the present invention, the transparent protective layer provided between the anode or the cathode and the organic layer contains a bipolar charge transport organic compound and an electron accepting compound, and, thus, the transparent protective layer has excellent charge transfer properties imparted through the action of the electron accepting compound on the bipolar charge transport organic compound. Accordingly, for example, even when the anode or the cathode is formed on the transparent protective layer, for example, by sputtering, the transparent protective layer even when exposed to impact of oxygen in the atmosphere or oxygen released from a target, sputtered particles produced in the formation of electrodes, Ar$^+$ ions, ionized ions or the like can maintain a high level of charge transfer properties. Further, the provision of the transparent protective layer so as to cover the organic layer can prevent the organic layer from undergoing damage which leads to deteriorated characteristics. As a result, the characteristics of the organic layer are not deteriorated, and the transparent protective layer can also maintain a high level of charge transfer properties. Therefore, an organic electroluminescent element which has excellent current-voltage characteristics and luminescence characteristics and does not cause lowered luminescence properties (for example, lowered current density, lowered luminescence efficiency, and the occurrence of leak current) can be provided.

Further, according to the present invention, since the charge transport organic compound constituting the transparent protective layer is bipolar, charge transport for any of holes and electrons is possible. Accordingly, for example, when the organic layer has a layer construction of hole injection/transport layer—luminescent layer—electron injection/transport layer, the transparent protective layer may be formed on any of the hole injection/transport layer side and the electron injection/transport layer side.

Thus, according to the present invention, an organic electroluminescent element which has excellent current-voltage characteristics and luminescence characteristics and does not cause a lowering in luminescence characteristics can be provided, and, thus, the present invention is very convenient in terms of characteristics of the element and the manufacture of the element.

In the present invention, whether the transparent protective layer is provided between the anode and the organic layer or between the cathode and the organic layer depends upon the order of formation (film formation) of the anode and the cathode. That is, when the anode is formed earlier than the cathode, the transparent protective layer is provided on the organic layer provided on the anode followed by the provision of the cathode to manufacture the element. Accordingly, the organic electroluminescent element thus obtained is of a top emission type (or both side light emission-type) that emits light at least from the cathode side. On the other hand, when the cathode is formed earlier than the anode, the transparent protective layer is provided on the organic layer provided on the cathode followed by the provision of the anode to manufacture the element. Accordingly, the organic electroluminescent element thus obtained is of a top emission type (or both side light emission-type) that emits light at least from the anode side.

In a preferred embodiment of the organic electroluminescent element according to the present invention, the electron accepting compound is molybdenum trioxide or vanadium pentoxide.

In a preferred embodiment of the organic electroluminescent element according to the present invention, an electroconductive layer including a metal layer having a small work function is provided between the transparent protective layer and the organic layer.

According to the present invention, the provision of the electroconductive layer including a metal layer having a small work function between the transparent protective layer and the organic layer can realize efficient charge injection into a damage-free organic layer through a transparent proactive layer having good charge transfer properties. As a result, better current-voltage characteristics and luminescence characteristics can be realized.

Further, in a preferred embodiment of the present invention, the electroconductive layer comprises a first electroconductive layer that is a metal layer having a small work function, and a second electroconductive layer comprising at least a group 1 or 2 element of the periodic table, the first electroconductive layer being provided on the organic layer side.

According to the present invention, the first electroconductive layer which is a metal layer having a small work function can function to efficiently inject charges into the organic layer. Further, the second electroconductive layer provided on the first electroconductive layer functions to efficiently supply charges, supplied through the transparent protective layer having good charge transfer properties, from the cathode or the anode into the first electroconductive layer. As a result, charges can be efficiently injected into the damage-free organic layer through the transparent protective layer having good charge transfer properties, contributing to improved current-voltage characteristics and luminescence characteristics.

Further, in a preferred embodiment of the present invention, the first electroconductive layer is an aluminum thin film in a sea-island form, and the second metal layer is a layered thin film of MgAg.

In a preferred embodiment of the present invention, the bipolar charge transport organic compound is one or at least two compounds selected from the group consisting of CBP, spiro-CBP, CzTT, m-CP, TBADN, and derivatives thereof.

According to the present invention, there is also provided a light emitting display device comprising the above organic electroluminescent element.

In a preferred embodiment of the light emitting display device according to the present invention, the light emitting display device further comprises a thin-film transistor that drives the organic electroluminescent element by active driving.

According to another aspect of the present invention, there is provided a method for manufacturing an organic electroluminescent element comprising a luminescent material-containing organic layer held between an anode and a cathode and a transparent protective layer provided between the anode or the cathode and the organic layer, the transparent protective layer containing a bipolar charge transport organic compound and an electron-accepting compound, the method comprising forming the transparent protective layer in a period of time between after the formation of the organic layer and before the formation of the anode or the cathode on the organic layer, the anode or the cathode being formed of an inorganic transparent electroconductive film.

In general, the inorganic transparent electroconductive film is formed by sputtering or the like and thus is advantageous in that the film is dense, has relatively high electroconductivity, and further has relatively high transparency. Accordingly, the emitted light can be efficiently taken out from the luminescent material-containing organic layer. The sputtering or the like, however, is a film forming method that causes damage, including a deterioration in characteristics, to the organic compound constituting the organic layer. In the method according to the present invention, the transparent protective layer is formed in a period between after the formation of the organic layer and before the formation of the inorganic transparent electroconductive film on the organic layer, and, thus, damage, including a deterioration in characteristics, to the organic layer by sputtering or the like in the formation of the inorganic transparent electroconductive film can be prevented.

BRIEF DESCRIPTION OF THE INVENTION

Figure 15:
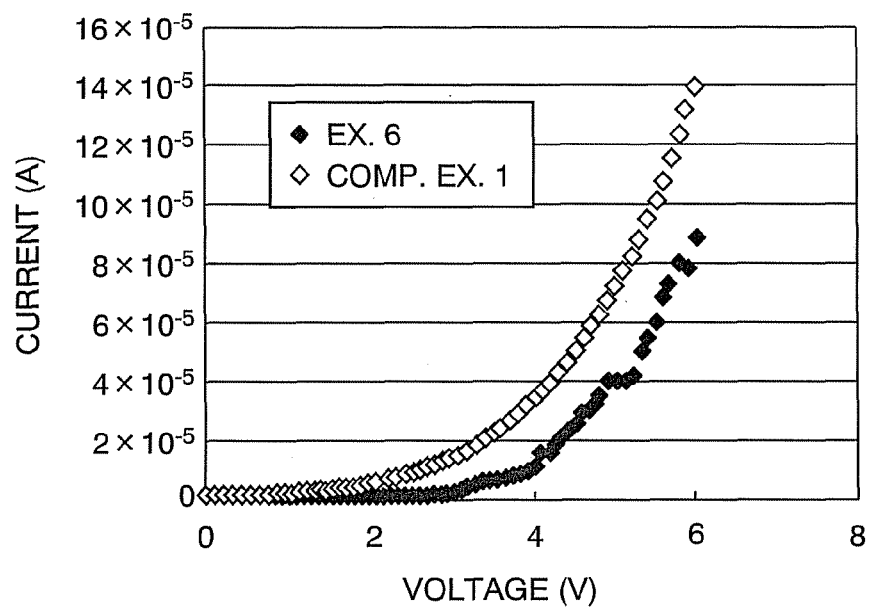
Figure 16:
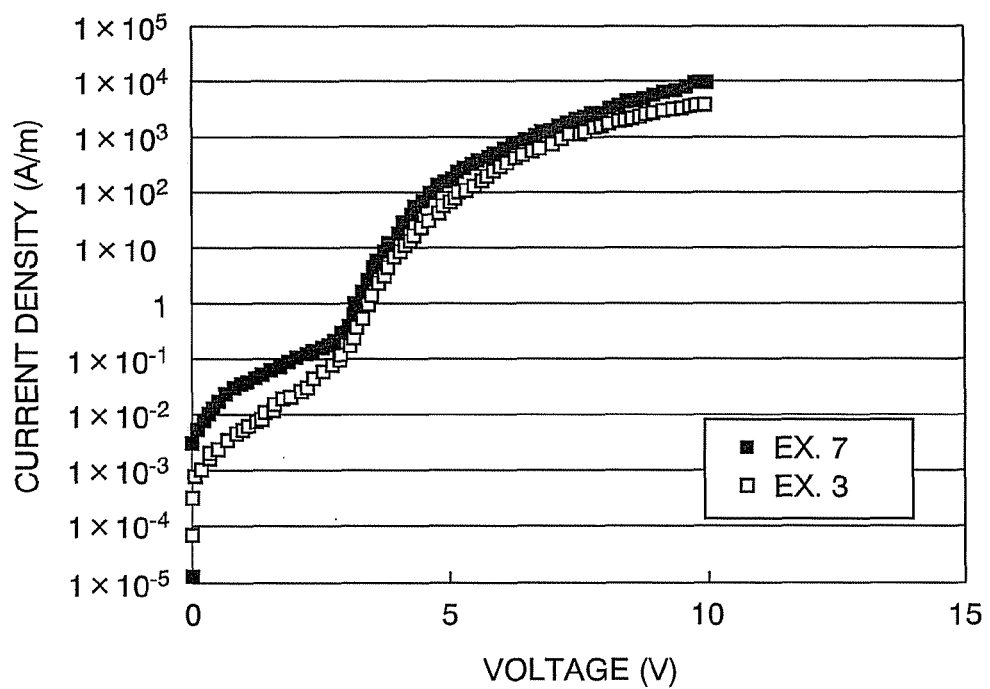

FIG. 15 is a graph showing brightness-voltage characteristics of the organic EL element of Example 6 and brightness-voltage characteristics of the organic EL element of Comparative Example 1; and FIG. 16 is a graph showing current density-voltage characteristic of the light emitting display device of Example 7 together with current density-voltage characteristics of the organic EL element of Example 3.

Reference characters in the drawings are as follows. 1: Base material, 2: anode, 3: organic layer, 3a: hole injection/transport layer, 3b: luminescent layer, 3c: electron injection/transport layer, 4: transparent protective layer, 5: cathode, 6, 6': electroconductive layer, 6a: first electroconductive layer, 6b: second electroconductive layer, 10, 10A, 10B, 10C: organic EL element, 20, 20A, 20B: light emitting display device, 21: thin-film transistor, 22: gate bus line, 23: source bus line, 24: organic EL element (organic layer containing luminescent material), 25: capacitor, 26: horizontal drive circuit, 27: vertical drive circuit, 31: gate electrode, 32: gate insulating film, 33: semiconductor film, 34: source electrode, 35: drain electrode, and 36: protective film.

DETAILED DESCRIPTION OF THE INVENTION

The organic electroluminescent element (hereinafter referred to as "organic EL element") according to the present invention, the method for manufacturing the organic electroluminescent element, and a light emitting display device will be described in detail.

<Organic EL Element and Method for Manufacturing the Organic EL Element>

Figure 1:
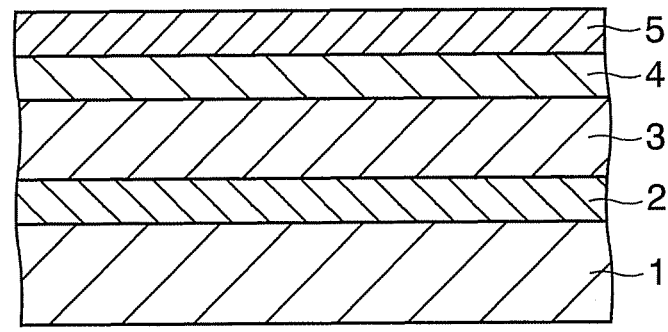
FIG. 1 is a typical cross-sectional view of a basic structure of the organic EL element according to the present invention.

FIG. 1 is a typical cross-sectional view showing a basic structure of the organic EL element according to the present invention. The organic EL element 1A shown in FIG. 1 is a light emitting element comprising a luminescent material-containing organic layer 3 held between an anode 2 and a cathode 5. A transparent protective layer 4 containing a bipolar charge transport organic compound and an electron accepting compound is provided between the anode 2 or the cathode 5 and the organic layer 3. In FIG. 1, the anode 2, the organic layer 3, the transparent protective layer 4, and the cathode 5 are provided in that order on a base material 1, and the transparent protective layer 4 is provided between the organic layer 3 and the cathode 5.

Whether the transparent protective layer 4 is provided between the organic layer 3 and the cathode 5 (see FIG. 1) or between the organic layer 3 and the anode 2 (not shown) is based on the order of film formation of the anode 2 and the cathode 5. That is, as shown in FIG. 1, when the anode is provided before the provision of the cathode on the base material 1, the transparent protective layer 4 is provided on the organic layer 3, and the cathode 5 is then provided to form a top emission-type (or both side light emission-type) organic EL element 1A which emits light at least from the cathode 5 side. On the other hand, when the cathode (not shown) is provided before the provision of the anode on the base material, the transparent protective layer is provided on the organic layer, and the anode is then provided to form a top emission-type (or both side light emission-type) organic EL element which emits light at least from the anode side.

Figure 2:
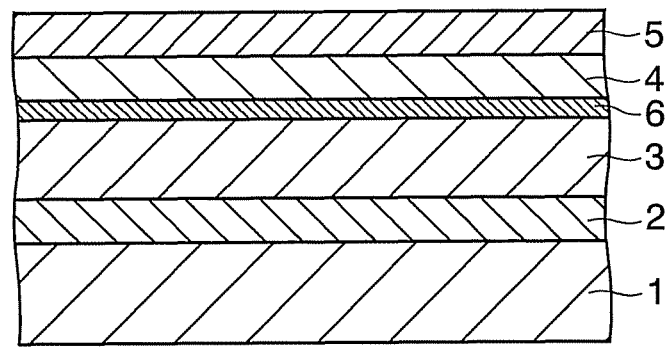
FIG. 2 is a typical cross-sectional view of another embodiment of the organic EL element according to the present invention.

FIG. 2 is a typical cross-sectional view showing another one embodiment of the organic EL element according to the present invention. An organic EL element 1B shown in FIG. 2 has the same construction as the organic EL element 1A shown in FIG. 1, except that an electroconductive layer 6 is provided between the organic layer 3 and the transparent protective layer 4, and the electroconductive layer 6 contains a metal layer having a small work function.

Figure 3:
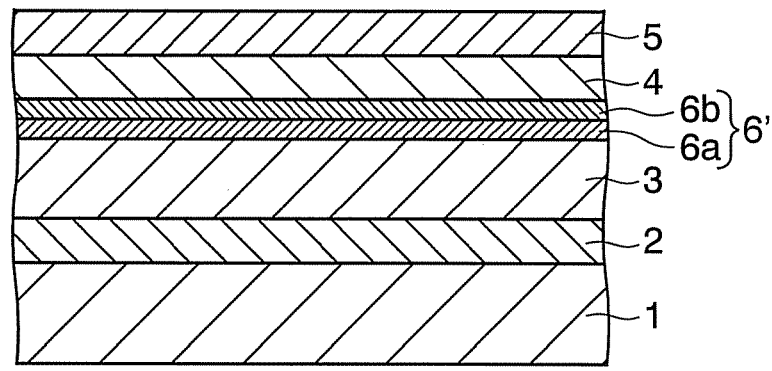
FIG. 3 is a typical cross-sectional view of still another embodiment of the organic EL element according to the present invention.

FIG. 3 is a typical cross-sectional view showing still another one embodiment of the organic EL element according to the present invention. The organic EL element 1C shown in FIG. 3 has the same construction as the organic EL element 1C shown in FIG. 2, except that an electroconductive layer 6' comprising a first electroconductive layer 6a, which is a metal layer having a small work function, and a second electroconductive layer 6b containing at least a group 1 or 2 element of the periodic table is provided instead of the electroconductive layer 6 in the organic EL element IC shown in FIG. 2. In this embodiment, the first electroconductive layer 6a is provided on the organic layer 3 side.

The elements constituting the organic EL element will be described in detail with reference to FIGS. 1 to 3 (when any drawing is not specified, the drawing is referred to as "FIG. 1 or the like"). In the following description, the construction will be described using an embodiment where an anode 2, an organic layer 3 having a three-layer structure of hole injection/transport layer—luminescent layer (layer containing luminescent material)—electron injection/transport layer, a transparent protective layer 4, and a cathode 5 are provided in that order on a base material 1. The present invention, however, is not limited to this embodiment.

Accordingly, the organic EL element may have a layer construction comprising a cathode, an organic layer having a three-layer structure of an electron injection/transport layer—luminescent layer (layer containing luminescent material)—hole injection/transport layer, a transparent protective layer, and an anode provided in that order from the base material 1 side (not shown). Also in this case, they have the same function and effect as those described below, and all of them constitute a top emission-type (or both side light emission-type) organic EL element. To this end, the transparent or semi-transparent anode provided on the organic layer is provided through the transparent protective layer.

<Base Material>

As shown in FIG. 1 or the like, the base material 1 supports the anode 2, the organic layer 3, the transparent protective layer 4, the cathode 5 and the like. Since the organic EL element according to the present invention is a top emission-type light emitting element that takes out light from the side (cathode 5 side) on which the layers are successively stacked, the base material 1 may be transparent or may not be transparent. In the case of the both side light emission type which takes out light also from the anode 2 side, the base material 1 used is transparent.

Materials usable for constituting the base material 1 include, for example, inorganic materials such as quartz, glass, silicon wafers, and glass with TFT (thin-film transistor) formed thereon. The base material may be formed of a polymer material, and examples of such polymer materials include polycarbonates (PCs), polyethylene terephthalates (PETs), polybutylene terephthalates (PBTs), polyphenylene sulfides (PPSs), polyimides (PIs), polyamide-imides (PAIs), polyether sulfones (PESs), polyether imides (PEIs), and polyetherether ketones (PEEKs).

Among them, quartz, glass, silicon wafers, or super engineering plastics such as polyimides (PIs), polyamide-imides (PAIs), polyether sulfones (PESs), polyether imides (PEIs), and polyetherether ketones (PEEKs) are preferred, because these materials are resistant to a temperature of 200° C. or above and can increase the temperature of the base material in the production process. In particular, when an active drive-type light emitting display device using TFT is manufactured, the temperature becomes high during the production process and, thus, the above materials are suitable.

The thickness of the base material 1 may be properly selected depending upon materials used and applications of the organic EL element Specifically, the thickness of the base material 1 is about 0.005 mm to 5 mm.

When the above polymer material is used as a material for constituting the base material 1, there is a possibility that the organic layer 3 is deteriorated by gas evolved from the polymer material. Therefore, preferably, a gas barrier layer (not shown) is provided between the base material 1 and the anode 2. Such materials for constituting the gas barrier layer include silicon oxide and silicon nitride.

<Anode>

The anode 2 is an electrode that supplies holes into a luminescent material-containing organic layer 3 which is subsequently formed. Since the organic EL element exemplified in FIGS. 1 to 3 is a top emission-type light emitting element in which light is taken out from the side (cathode 5 side) on which the layers are successively stacked, the anode 2 may be transparent or may not be transparent. In the case of the both side light emission type which takes out light also from the anode 2 side, however, the base material 1 used is transparent.

Materials for constituting the anode 2 are not particularly limited as long as they are electroconductive materials, and examples thereof include metals as a single substance, such as gold (Au), tantalum (Ta), tungsten (W), platinum (Pt) nickel (Ni), palladium (Pd), chromium (Cr), copper (Cu), molybdenum (Mo), alkali metals, alkaline earth metals, oxides of these metals, and alloys, for example, aluminum (Al) alloys such as AlLi, AlCa, and AlMg, magnesium (Mg) alloys such as MgAg, nickel (Ni) alloy, chromium (Cr) alloy, alloys of alkali metals, and alloys of alkaline earth metals. These electroconductive materials may be used either solely or in a combination of two or more, or alternatively two or more electroconductive materials may be stacked on top of each other.

Electroconductive oxides such as In—Sn—O (ITO), In—Zn—O (IZO), Zn—O, Zn—O—Al, or Zn—Sn—O may also be used as the material for constituting the anode 2. Further, electroconductive polymers such as metal-doped polythiophene, polyaniline, polyacetylene, polyalkylthiophene derivatives, and polysilane derivatives, $\alpha$-Si, $\alpha$-SiC and the like may also be used as the material for constituting the anode 2. When the anode 2 is transparent so that light can also be taken out from the anode side, ITO and IZO are particularly preferred. ITO and IZO have high electroconductivity and light transmission and have low electrical resistivity. Accordingly, the takeout efficiency of light can be improved, and the drive voltage of the organic layer 3 can be lowered.

The thickness of the anode 2 is not particularly limited and may be properly determined depending upon the electroconductive material used. Specifically, the thickness of the anode 2 is preferably in the range of 5 nm to 1000 nm, more preferably 40 nm to 500 nm. The anode 2 may be formed, for example, by chemical vapor deposition or physical vapor deposition such as vacuum deposition, sputtering, or ion plating.

In FIG. 1 and the like, the anode 2 is provided on the base material 1 and thus is not always transparent. When a method is adopted in which the cathode 5 is provided on the base material 1, an organic layer 3 is formed, and the anode 2 is then formed, as with the cathode 5 which will be describe later, the anode 2 is formed of ITO or IZO which is a transparent electroconductive film.

<Organic Layer>

The organic layer 3 is a luminescent material-containing layer (hereinafter referred to as "luminescent layer") and has a layer structure of one or at least two layers including at least a luminescent layer. In FIGS. 1 to 3, the organic layer 3 is not shown in detail but may take various forms. Examples of such forms include an organic layer having a single structure of luminescent layer, an organic layer having a two-layer structure of hole injection/transport layer—luminescent layer, an organic layer having a two-layer structure of luminescent layer—electron injection/transport layer, an organic layer having a three-layer structure of hole injection/transport layer—luminescent layer—electron injection/transport layer, and an organic layer having a five-layer structure of hole injection layer/hole transport layer/luminescent layer/electron transport layer/electron injection layer. In the organic layer having the five-layer structure, if necessary, any layer may be omitted, or alternatively, for example, a layer that prevents the passage of holes or electrons and prevents the diffusion of excitons to confine the excitons within the luminescent layer and thus to enhance the recombination efficiency may be added.

Figure 4:
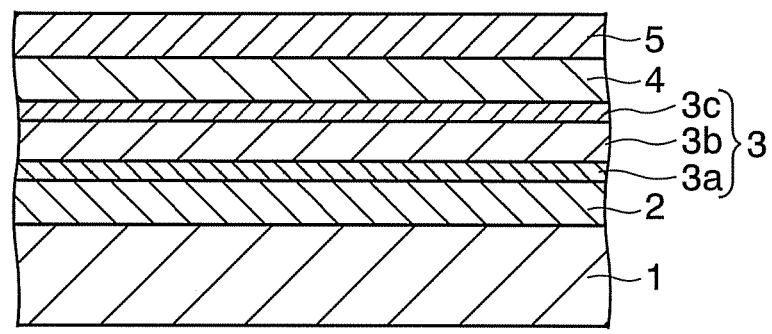
FIG. 4 is a cross-sectional view of an embodiment of a more specific construction of the organic EL element shown in FIG. 1.
Figure 5:
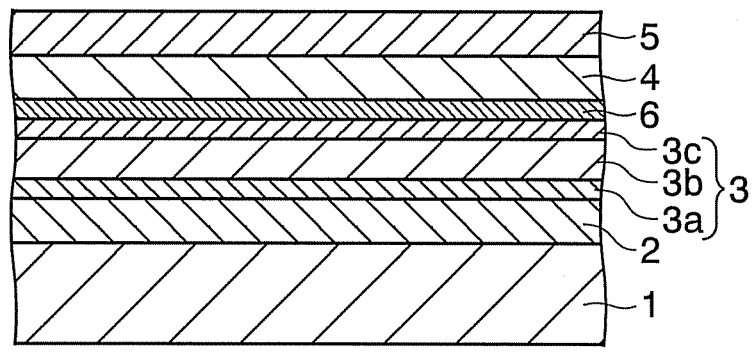
FIG. 5 is a cross-sectional view of an embodiment of a more specific construction of the organic EL element shown in FIG. 2.
Figure 6:
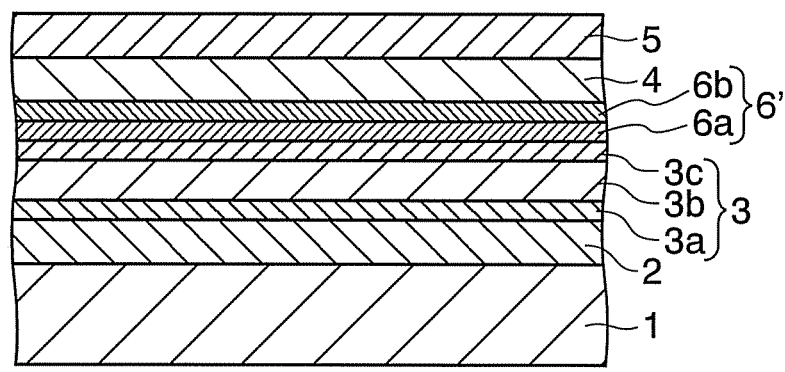
FIG. 6 is a cross-sectional view of an embodiment of a more specific construction of the organic EL element shown in FIG. 3.

For the hole transport layer, in many cases, a hole transport function is imparted to the hole injection layer to constitute a layer that has both a hole injection function and a hole transport function and is called a hole injection/transport layer. Also for the electron transport layer, in many case, an electron transport function is imparted to the electron injection layer to constitute a layer that has both an electron injection function and an electron transport function and is called an electron injection/transport layer. Therefore, in the following description, the present invention will be described in more detail by taking, as a typical construction example, an organic layer 3 having a construction of a hole injection/transport layer 3a, a luminescent layer 3b, and an electron injection/transport layer 3c as viewed from the anode 2 side, as shown in FIG. 4, as an example. However, it should be noted that the layer construction of the organic layer 3 is not limited thereto. FIG. 4 shows a more specific example of the construction of the organic EL element that does not have an electroconductive layer and is shown in FIG. 1. FIG. 5 shows a more specific example of the construction of the organic EL element that has an electroconductive layer having a single layer structure and is shown in FIG. 2. FIG. 6 shows a more specific example of the construction of the organic EL element that has an electroconductive layer having a two layer structure and is shown in FIG. 3.

<Hole Injection/Transport Layer>

The hole injection/transport layer 3a constitutes a part of the organic layer 3 in an embodiment where the hole injection/transport layer 3a is in contact with the anode 2. The hole injection/transport layer 3a functions to stabilize the injection of holes into the luminescent layer 3b and, at the same time, to enhance the luminescence efficiency.

The hole injection/transport layer 3a is provided between the anode 2 and the luminescent layer 3b and thus is not particularly limited as long as the hole injection/transport layer 3a is a layer that functions to transport holes, injected from the anode 2, into the luminescent layer 3b. As long as the hole injection/transport layer 3a has a hole injection function and a hole transport function, the hole injection/transport layer 3a may have a structure of a single layer called a hole injection layer, a structure of a single layer called a hole transport layer, or a two-layer structure of a layer called a hole injection layer and a layer called a hole transport layer and may not be provided as a hole injection/transport layer when the luminescent layer 3b has both a hole injection function and a hole transport function.

The material for constituting the hole injection/transport layer 3a is not particularly limited as long as the material can stably transport holes, injected from the anode 2, into the luminescent layer 3b. Examples of such materials usable for constituting the hole injection/transport layer include, in addition to compounds exemplified as luminescent materials (coloring matter luminescent materials, metal complex luminescent materials, or polymer luminescent materials) of the luminescent layer 3b which will be described later, arylamines, starhurst amines, phthalocyanines, oxides such as vanadium oxide, molybdenum oxide, ruthenium oxide, and aluminum oxide, amorphous carbon, electroconductive polymers such as polyanilines, polythiophenes, and polyphenylene vinylenes and derivatives thereof. The electroconductive polymers such as polyanilines, polythiophenes, and polyphenylene vinylenes and derivatives thereof may be doped with an acid. Specific examples thereof include N,N'-bis(naphthalen-1-yl)-N,N'-bis(phenyl)-benzidine ($\alpha$-NPD), 4,4,4-tris(3-methylphenylphenylamino)triphenylamine (MTDATA), poly(3,4-ethylenedioxythiophene)-polystyrene sulfonic acid (PEDOT-PSS), and polyvinyl carbazole (PVCz).

Among them, bipolar materials that can transport holes and electrons are preferred as the material for constituting the hole injection/transport layer 3a. The use of the bipolar material in the hole injection/transport layer 3a can effectively suppress a deterioration at the interface of the luminescent layer 3b and the hole injection/transport layer 3a during drive. The bipolar material will be described later in detail in connection with the transparent protective layer, and, thus, the description thereof will be omitted here.

When both the hole injection/transport layer 3a and the electron injection/transport layer 3c which will be described later contain a bipolar material, the bipolar material contained in the hole injection/transport layer 3a and the bipolar material contained in the electron injection/transport layer 3c may be the same or different. Further, when all the hole injection/transport layer 3a, the luminescent layer 3b, and the electron injection/transport layer 3c contain a bipolar material, the bipolar material contained in the hole injection/transport layer 3a, the bipolar material contained in the luminescent layer 3b, and the bipolar material contained in the electron injection/transport layer 3c may be the same or different.

When the material for constituting the hole injection/transport layer 3a is an organic compound (an organic compound for a hole injection/transport layer), preferably, the formed hole injection/transport layer 3a has a region, where a oxidizing dopant has been mixed into the organic compound for the hole injection/transport layer, at least at the interface between the hole injection/transport layer 3a and the anode 2. When the region is present at least at the interface between the anode 2 and the hole injection/transport layer 3a, the hole injection barrier can be decreased in the injection of holes from the anode 2 into the hole injection/transport layer 3a, resulting in lowered drive voltage.

The process of injection of holes from the anode 2 into the hole injection/transport layer 3a (the organic layer 3 comprising the hole injection/transport layer 3a and the like being basically formed of an insulating material) is based on the oxidation of the organic compound at the surface of the anode 2, that is, the formation of a radical cation state (Phys. Rev. Lett., 14, 229 (1965)). As described above, when the hole injection/transport layer 3a on its side in contact with the anode 2 is previously doped with the oxidizing dopant having the function of oxidizing the organic compound, the energy barrier in the injection of holes from the anode 2 can be decreased. The organic compound in the state of being oxidized by the oxidizing dopant (that is, in an electron donated state) is present in the hole injection/transport layer 3a doped with the oxidizing dopant. Accordingly, the energy barrier in the injection of holes is small, and, thus, the drive voltage can be advantageously rendered smaller than that in the conventional organic EL element. The oxidizing dopant used may be the same as that contained in the transparent protective layer which will be described later.

A concentration which can improve charge transfer properties is properly selected as the content of the oxidizing dopant, as with the description in connection with the transparent protective layer which will be described later.

When hole injection/transport layer 3a has a region where the oxidizing dopant has been mixed into the organic compound for the hole injection/transport layer, the presence of the region at least at the interface between the hole injection/transport layer 3a and the anode 2 suffices for contemplated results. For example, the oxidizing dopant may be doped evenly in the whole area in the thickness-wise direction of the hole injection/transport layer 3a; or the oxidizing dopant may be doped so that the content of the oxidizing dopant in the hole injection/transport layer 3a is continuously increased from the luminescent layer 3b side toward the anode 2; or the oxidizing dopant may be locally doped only at the interface between the hole injection/transport layer 3a and the anode.

Methods for hole injection/transport layer 3a formation include, for example, dry methods such as vacuum vapor deposition and sputtering and wet methods such as printing, ink jetting, spin coating, casting, dip coating, bar coating, blade coating, roll coating, gravure coating, flexo printing, and spray coating.

The thickness of the hole injection/transport layer 3a is not particularly limited as long as holes can be injected from the anode and can be transported in the luminescent layer. Specifically, the thickness of the hole injection/transport layer 3a may be approximately 0.5 nm to 1000 nm and is particularly preferably in the range of 5 nm to 500 nm.

<Luminescent Layer>

The luminescent layer 3b has the function of providing an opportunity for the recombination of electrons with holes to emit light. For example, as shown in FIG. 4, the luminescent layer 3b is held between the hole injection/transport layer 3a and the electron injection/transport layer 3c. Materials for constituting the luminescent layer 3b include coloring matter luminescent materials, metal complex luminescent materials, and polymer luminescent materials.

Such coloring matter luminescent materials include, for example, cyclopentadiene derivatives, tetraphenylbutadiene derivatives, triphenylamine derivatives, oxadiazole derivatives, pyrazoloquinoline derivatives, distyrylbenzene derivatives, distyrylarylene derivatives, silole derivatives, thiophene ring compounds, pyridine ring compounds, perinone derivatives, perylene derivatives, oligothiophene derivatives, trifumanylamine derivatives, coumarin derivatives, oxadiazole dimers, and pyrazoline dimers.

Examples of such metal complex luminescent materials include metal complexes comprising, for example, aluminum (Al), zinc (Zn), beryllium (Be), iridium (Ir), or platinum (Pt), or a rare earth metal such as terbium (Tb), europium (Eu), or dysprosium (Dy) as a central metal and, for example, an oxadiazole, thiadiazole, phenylpyridine, phenylbenzoimidazole, or quinoline structure as a ligand. Examples of such metal complexes include quinolinol aluminum complex, benzoquinolinol beryllium complex, benzoxazolyl zinc complex, benzothiazole zinc complex, azomethyl zinc complex, porphyrin zinc complex, europium complex, iridium metal complex, and platinum metal complex. Specific examples thereof include tris(8-quinolinolate)aluminum complex ($Alq_3$).

Examples of such polymer luminescent materials include poly-p-phenylenevinylene derivatives, polythiophene derivatives, poly-p-phenylene derivatives, polysilane derivatives, polyacetylene derivatives, polyvinylcarbazole derivatives, polyfluorenone derivatives, polyfluorene derivatives, polyquinoxaline derivatives, polydialkylfluorene derivatives, and their copolymers. Polymers obtained by polymerizing the above coloring matter luminescent materials and metal complex luminescent materials may also be used.

The material for constituting the luminescent layer 3b may be a bipolar material. The use of the bipolar material as the material for constituting the luminescent layer can effectively suppress a deterioration at the interface between the hole injection/transport layer 3a and the luminescent layer 3b during drive or a deterioration at the interface between the luminescent layer 3b and the electron injection/transport layer 3c. The bipolar material may be a luminescent material that as such exhibits fluorescence or phosphorescence or a host material that is doped with a luminescent dopant which will be described later. The bipolar material will be described later in detail in connection with the transparent protective layer 4, and, thus, the description thereof will be omitted.

From the viewpoint of improving the luminescence efficiency or varying the luminescence wavelength, the luminescent layer 3b may contain a luminescent dopant that exhibits fluorescence or phosphorescence. That is, the luminescent layer 3b may comprise a host material comprising at least one of the coloring matter luminescent materials, metal complex luminescent materials, polymer luminescent materials, bipolar materials and the like and a luminescent dopant. Luminescent dopants include, for example, perylene derivatives, coumarin derivatives, rubrene derivatives, quinacridone derivatives, squalium derivatives, porphyrin derivatives, styryl coloring matters, tetracene derivatives, pyrazoline derivatives, decacyclene derivatives, phenoxazone derivatives, quinoxaline derivatives, carbazole derivatives, and fluorene derivatives.

The thickness of the luminescent layer 3b is not particularly limited as long as the function of providing an opportunity for recombination of electrons with holes to emit light can be developed. The thickness of the luminescent layer 3b may be approximately 1 nm to 200 nm.

The method for forming the luminescent layer is not particularly limited as long as a fine pattern required of the organic EL element can be formed. Examples of such methods include vapor deposition, printing, ink jetting, spin coating, cast coating, dip coating, bar coating, blade coating, roll coating, gravure coating, flexo printing, spray coating, and a self-organizing method (an alternate adsorption method or a self-assembled monolayer method). Among them, vapor deposition, spin coating, and ink jetting are preferred.

When the formation of a luminescent layer 3b containing the host material and the luminescent dopant is contemplated, the codeposition of the host material and the luminescent dopant is preferred. When the luminescent layer 3b is formed in a thin film form by coating using a solution, for example, spin coating or dip coating may be used. In this case, preferably, the host material and the luminescent dopant are used in the form of a dispersion obtained by dispersing the host material and the luminescent dopant in an inert polymer. When the provision of a distribution in the thickness-wise direction to form an inclined luminescent dopant concentration structure in the luminescent layer 3b is contemplated, for example, a method may be adopted in which the deposition rate of the host material and the luminescent dopant is continuously or periodically varied.

When the preparation of a full-color display or multi-color display light emitting display device using the organic EL element according to the present invention is contemplated, luminescent layers 3b which exhibit different colors should be finely formed and arranged in a predetermined manner. Accordingly the luminescent layer 3b should be formed in a pattern form. Methods for forming the luminescent layer 3b in a pattern form include a method in which layers that exhibit respective luminescence colors are coated separately from each other or vapor-deposited by masking and a method in which layers that exhibit respective luminescence colors are coated separately from each other by printing or ink jetting.

Alternatively, the luminescent layer 3b may be formed in a pattern form by previously forming partition walls (not shown) for respective areas where layers that exhibit respective luminescence colors are coated separately from each other, and then forming, as the luminescent layer 3b, layers capable of exhibiting different luminescence colors within the areas partitioned by the partition walls. The formation of the partition walls is advantageous in that, in the formation of the luminescent layer by ink jetting or the like, the luminescent material is not wet-spread in adjacent areas. Materials usable for constituting the partition walls include photosensitive polyimide resins, photocurable resins such as acrylic resins, and heat curable resins. The partition walls may also be formed of an inorganic material or the like. The partition walls may be subjected to treatment that varies the surface energy (wettability) of the partition walls.

In the formation of the luminescent layer 3b, a method may be adopted in which the partition walls or the like are if necessary be provided on the hole injection/transport layer 3a formed in a blotted form, and layers capable of exhibiting different luminescence colors are coated separately from each other, or alternatively a method may be adopted in which the partition walls or the like are if necessary provided on the anode 2, and the hole injection/transport layer 3a is stacked followed by stacking of layers, capable of exhibiting different luminescence colors, as the luminescent layer 3b, separately from each other by coating.

<Electron Injection/Transport Layer>

The electron injection/transport layer 3c is provided between the luminescent layer 3b and the cathode 5 and thus is not particularly limited as long as electrons injected from the cathode 5 can be stably transported to the luminescent layer 3b. As long as the electron injection/transport layer 3c has an electron injection function and an electron transport function, the electron injection/transport layer 3c may have a structure of a single layer called an electron injection layer, a structure of a single layer called an electron transport layer, or a two layer structure of a layer called an electron injection layer and a layer called an electron transport layer. Further, when the luminescent layer 3b has both an electron injection function and an electron transport function, the provision of the electron injection/transport layer may be omitted.

The constituent materials having the electron injection function is not particularly limited as long as the injection of electrons into the luminescent layer 3b can be stabilized. Examples of such materials include, in addition of compounds exemplified as luminescent materials (coloring matter luminescent materials, metal complex luminescent materials, or polymer luminescent materials) for the luminescent layer 3b, alkali metals or alkaline earth metals such as barium (Ba), calcium (Ca), lithium (Li), cesium (Cs), magnesium (Mg), or strontium (Sr) as a simple substance; fluorides of alkali metals or alkaline earth metals such as magnesium fluoride, calcium fluoride, strontium fluoride, barium fluoride, lithium fluoride, or cesium fluoride; alloys of alkali metals such as aluminum lithium alloys; metal oxides such as magnesia oxide, strontium oxide, or aluminum oxide; and organic complexes of alkali metals such as sodium polymethyl methacrylate polystyrene sulfonate.

The constituent material having the electron transport function is not particularly limited as long as the material can transport electrons, injected from the cathode 5, into the luminescent layer 3b. Examples of such materials include phenanthroline derivatives such as bathocuproine (BCP) or bathophenanthroline (Bpehn), triazole derivatives, and oxadiazole derivatives, and aluminum quinolinol complexes such as tris (8-hydroxyquinolinolate)aluminum ($Alq_3$).

Among them, bipolar materials which can transport holes and electrons are preferred as the material for constituting the electron injection/transport layer 3c. The use of the bipolar material in the electron injection/transport layer 3c can effectively suppress a deterioration at the interface between the luminescent layer 3b and the electron injection/transport layer 3c during drive. The bipolar material will be described later in detail in connection with the transparent protective layer, and, thus, the description thereof will be omitted.

When both the electron injection/transport layer 3c and the hole injection/transport layer 3a contain a bipolar material, the bipolar material contained in the electron injection/transport layer 3c and the bipolar material contained in the hole injection/transport layer 3a may be the same or different.

When all the hole injection/transport layer 3a, the luminescent layer 3b, and the electron injection/transport layer 3c contain a bipolar material, the bipolar material contained in the hole injection/transport layer 3a, the bipolar material contained in the luminescent layer 3b, and the bipolar material contained in the electron injection/transport layer 3c may be the same or different.

When material for constituting the electron injection/transport layer 3c is an organic compound (an organic compound for an electron injection/transport layer), preferably, the formed electron injection/transport layer 3c has a region, at least at the interface between the electron injection/transport layer 3c and the cathode 5, where a reducing dopant has been mixed into the organic compound for the electron injection/transport layer. The presence of the region at least at the interface between the cathode 5 and the electron injection/transport layer 3c can decrease the electron injection barrier in the injection of electrons from the cathode 5 into the electron injection/transport layer 3c and thus can lower the drive voltage.

The process of injection of electrons from the cathode 5 into the electron injection/transport layer 3c (the organic layer 3 comprising the electron injection/transport layer 3c and the like being basically formed of an insulating material) is based on the reduction of the organic compound at the surface of the cathode 5, that is, the formation of a radical anion state (Phys. Rev. Lett., 14, 229 (1965)). As described above, when the electron injection/transport layer 3c on its side in contact with the cathode 5 is previously doped with the reducing dopant having the function of reducing the organic compound, the energy barrier in the injection of electrons from the cathode 5 can be decreased. The organic compound in the state of being reduced by the reducing dopant (that is, in an electron received and injected state) is present in the electron injection/transport layer 3c doped with the reducing dopant. Accordingly, the energy barrier in the injection of electrons is small, and, thus, the drive, voltage can be advantageously rendered lower than that in the conventional organic EL element. In this case, preferably, a stable metal such as aluminum (Al) commonly used as a wiring material may be used as the cathode 5.

The reducing dopant is not particularly limited as long as the dopant has a property that reduces the organic compound for an electron injection/transport layer, but is usually an electron donating compound. The electron donating compound is preferably a metal (as a simple substance), a metal compound, or an organic metal complex. The metal (as a simple substance), the metal compound, or the organic metal complex comprises at least one metal selected from the group consisting of alkali metals, alkaline earth metals, and transition metals including rare earth metals. In particular, preferably, the metal (as a simple substance), the metal compound, or the organic metal complex comprises at least one metal selected from the group consisting of alkali metals, alkaline earth metals, and transition metals including rare earth metals that have a work function of not more than 4.2 eV. Such metals (as a simple substance) include, for example, lithium (Li), sodium (Na), potassium (K), cesium (Cs), beryllium (Be), magnesium (Mg), calcium (Ca), strontium (Sr), barium (Ba), yttrium (Y), lanthanum (La), magnesium (Mg), samarium (Sm), gadolinium (Gd), ytterbium (Yb), and tungsten (W). Examples of such metal compounds include metal oxides such as $Li_2O$, $Na_2O$, $K_2O$, $Rb_2O$, $Cs_2O$, MgO, and CaO, or metal salts such as LiF, NaF, KF, RbF, CsF, $MgF_2$, $CaF_2$, $SrF_2$, $BaF_2$, LiCl, NaCl, KCl, RbCl, CsCl, $MgCl_2$, $CaCl_2$, $SrCl_2$, and $BaCl_2$. Examples of such organic metal complexes include organic metal compounds including W or 8-hydroxyquinolinolato lithium (Liq). In particular, Cs, Li, and Liq are preferred. Doping of the organic compound for an electron injection/transport layer with the reducing dopant can provide good electron injection properties.

When the electron injection/transport layer 3c has a region where the reducing dopant has been mixed into the organic compound for the electron injection/transport layer, the presence of the region at least at the interface between the electron injection/transport layer 3c and the cathode 5 suffices for contemplated results. For example, the reducing dopant may be doped evenly in the whole area in the thickness-wise direction of the electron injection/transport layer 3c; or the reducing dopant may be doped so that the content of the reducing dopant in the electron injection/transport layer 3c is continuously increased from the luminescent layer 3b side toward the cathode 5; or the reducing dopant may be locally doped only at the interface between the electron injection/transport layer 3c and the cathode. A concentration which can improve charge transfer properties is properly selected as the content of the reducing dopant, as with the hole injection/transport layer 3a.

Methods for electron injection/transport layer 3c formation include, for example, dry methods such as vacuum vapor deposition and sputtering and wet methods such as printing, ink jetting, spin coating, casting, dip coating, bar coating, blade coating, roll coating, gravure coating, flexo printing, and spray coating.

The thickness of the electron injection/transport layer 3c is not particularly limited as long as the electron injection function and the electron transport function can be satisfactorily exhibited. The thickness of the electron injection/transport layer doped with the reducing dopant is not also particularly limited. In both the electron injection/transport layer 3c and the electron injection/transport layer doped with the reducing dopant, preferably, the thickness is in the range of 0.1 nm to 300 nm, more preferably in the range of 0.5 nm to 200 nm. When the thickness of the electron injection/transport layer 3c is below the lower limit of the above-defined range, the amount of the organic compound, for the electron injection/transport layer, that is present around the cathode interface and has been reduced with the reducing dopant is so small that the effect of doping is sometimes unsatisfactory. On the other hand, when the thickness of the electron injection/transport layer 3c is above the above-defined range, the thickness of the whole electron injection/transport layer is so large that the drive voltage is likely to rise.

<Transparent Protective Layer>

The transparent protective layer 4 is a layer provided between the anode or the cathode and the organic layer. In an embodiment shown in FIG. 4, the transparent protective layer 4 is provided on the electron injection/transport layer 3c, that is, is held between the electron injection/transport layer 3c and the cathode 5. The transparent protective layer 4 is a layer that is characteristic of the present invention and contains a bipolar charge transport organic compound and an electron accepting compound.

The most important function of the transparent protective layer 4 having the above construction is that the transparent protective layer 4 has a high level of charge transfer properties by virtue of the action of the electron accepting compound on the bipolar charge transport organic compound. Accordingly, when the anode or cathode (a cathode in an embodiment shown in FIG. 4) is formed on the transparent protective layer 4, for example, by sputtering, the transparent protective layer 4 can advantageously maintain a high level of charge transfer properties even upon exposure to impact of oxygen in the atmosphere or released from the target, and sputtered particles or argon ions (Ar⁺), ionized electrons or the like produced during electrode formation. Further, since the transparent protective layer 4 is provided so as to cover the organic layer 3 (the electron injection/transport layer 3c in the embodiment shown in FIG. 4), the organic layer 3 is protected and does not undergo damage including deteriorated characteristics. Accordingly, the organic layer 3 does not undergo damage including deteriorated characteristics, and the transparent protective layer 4 also can maintain a high level of charge transfer properties. Thus, an organic EL element can be advantageously provided that has excellent current-voltage characteristics and luminescence characteristics and does not cause lowered luminescence characteristics (such as lowered current density, lowered luminescence efficiency, or occurrence of leak current) can be provided.

Further, since the charge transfer organic compound constituting the transparent protective layer 4 has bipolar properties, charge transfer is possible for both holes and electrons. For example, when the organic layer 3 has a construction of hole injection/transport layer 3a—luminescent layer 3b—electron injection/transport layer 3c (see the embodiment shown in FIG. 4), the transparent protective layer may be provided on any of the hole injection/transport layer 3a side and the electron injection/transport layer 3c side. Furthermore, as described above, an organic electroluminescent element which has excellent current-voltage characteristics and luminescence characteristics and does not undergo a deterioration in luminescence characteristics can be provided, which is very convenient from the viewpoint of both characteristics and manufacture.

Whether the transparent protective layer 4 is provided between the anode 2 and the organic layer 3 or between the cathode 5 and the organic layer 3 is based on the order of film formation of the anode and the cathode. That is, when the anode 2 is provided earlier than the cathode 5 (see FIG. 4), the transparent protective layer 4 is provided on the organic layer 3, followed by the provision of the cathode 5 to provide a top emission-type (or both side light emission-type) organic EL element that emits light at least from the cathode 5 side. On the other hand, when the cathode 5 is provided earlier than the anode 2, the transparent protective layer 4 is provided on the organic layer 3, followed by the provision of the anode 2 to provide a top emission-type (or both side light emission-type) organic EL element that emits light from at least from the anode 2 side.

The bipolar material is a material that can stably transport both holes and electrons. When a unipolar device for electrons is prepared using a bipolar material doped with a reducing dopant, stable transport of electrons can be realized. On the other hand, when a unipolar device for holes is prepared using a bipolar material doped with an oxidizing dopant, stable transport of holes can be realized. In the present invention, for the bipolar charge transport organic compounds for constituting the transparent protective layer 4, all the materials which have been confirmed to have the capability of transporting charges (either holes or electrons) by such techniques can be used as the bipolar material in the present invention.

Bipolar charge transport organic compounds include, for example, distyrylarylene derivatives, polyaromatic compounds, aromatic condensed ring compounds, carbazole derivatives, and heterocyclic compounds. Specific examples thereof include organic compounds represented by chemical formulae 1 to 7, that is, 4,4-bis(carbazol-9-yl)biphenyl (CBP, chemical formula 1), 2,2',7,7'-tetrakis(carbazol-9-yl)-9,9'-spiro-bifluorene (spiro-CBP, chemical formula 2), 4,4"-di(N-carbazolyl)-2',3',5',6'-tetraphenyl-p-terphenyl (CzTT, chemical formula 3), 1,3-bis(carbazole-9-yl)-benzene (m-CP, chemical formula 4), 3-tert-butyl-9,10-di(naphtha-2-yl)anthracene (TBADN, chemical formula 5), 4,4',4"-tris(carbazolyl)-triphenylamine (TCTA, chemical formula 6), 9,10-bis[4-(6-methylbenzothiazol-2-yl)phenyl]anthracene (DBzA, chemical formula 7), and derivatives thereof. One or at least two compounds selected from these compounds may be used.

Formula 1

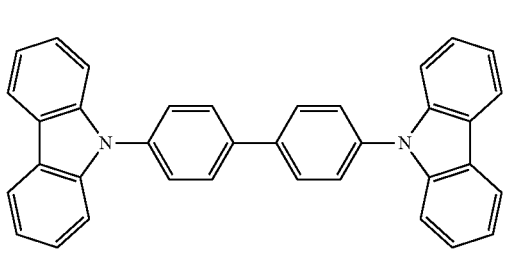

CBP

Formula 2

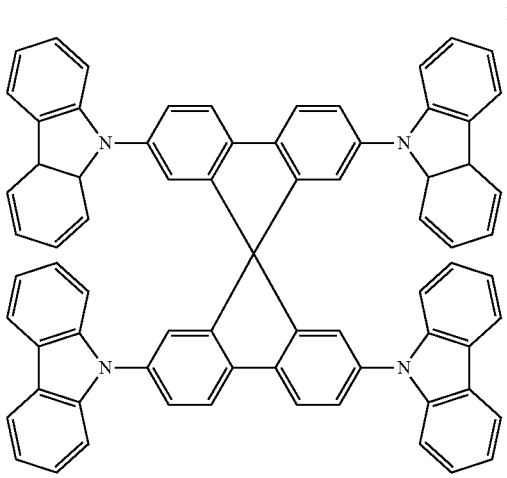

spiro-CBP

-continued
Formula 3
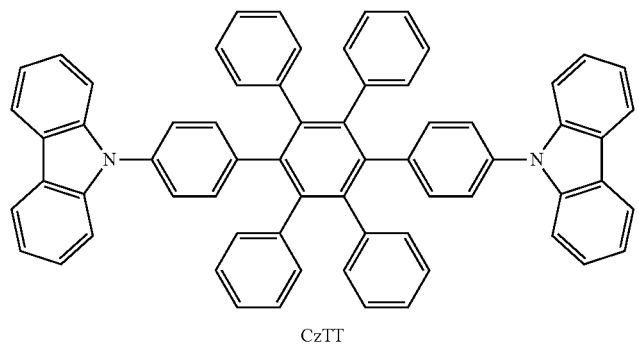
CzTT
Formula 4
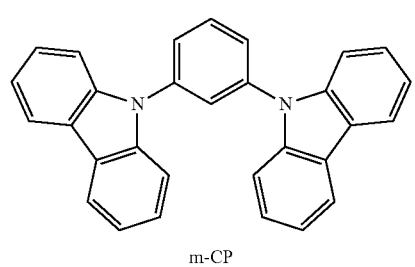
m-CP
Formula 5
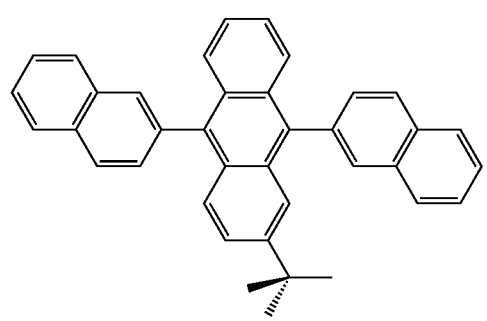
TBADN
Formula 6
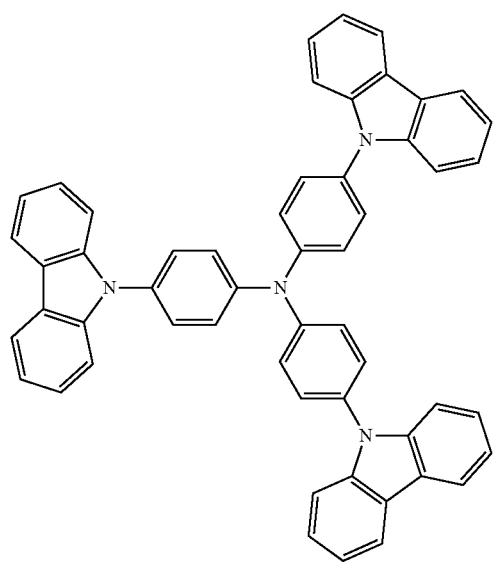
TCTA
Formula 7
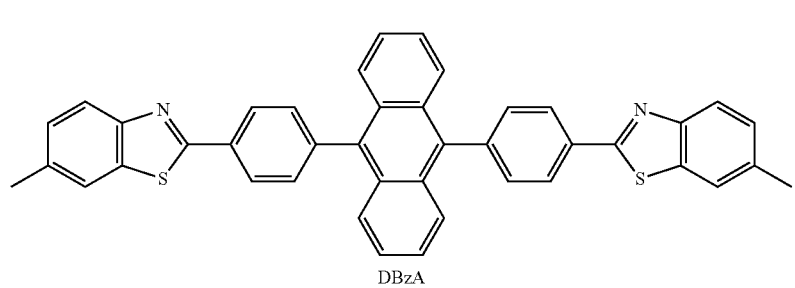
DBzA As described above, the dopant to be doped into the bipolar charge transport organic compound may be any of oxidizing dopants and reducing dopants. The dopant is mixed into the bipolar charge transport organic compound to form a mixed region that functions to move charges (holes or electrons) from the electrode (anode 2 or cathode 5) into the hole injection/transport layer 3a or the electron injection/transport layer 3c. The dopant to be mixed is preferably an oxidizing dopant. An oxidizing dopant-containing region formed in the hole injection/transport layer 3a or the electron injection/transport layer 3c can facilitate the transfer of charges from the electrode (anode 2 or cathode 5) into the hole injection/transport layer 3a or the electron injection/transport layer 3c. Although the reducing dopant-containing region can move charges, when an electrode such as a transparent electroconductive film is formed by sputtering or the like on the reducing dopant-containing transparent protective layer 4, in some cases, the reducing dopant undergoes an influence of, for example, a reaction of the reducing dopant with oxygen as the sputtering gas, resulting in lowered current characteristics.

The oxidizing dopant is not particularly limited as long as the dopant can oxidize the bipolar charge transport organic compound. In general, however, electron accepting compounds are used. Any of inorganic and organic electron accepting compounds may be used. When the electron accepting compound is an inorganic compound, for example, Lewis acids such as iron(II) chloride, aluminum chloride, gallium chloride, indium chloride, antimony pentachloride, molybdenum trioxide ($MoO_3$), and vanadium pentoxide ($V_2O_5$) may be mentioned as the electron accepting compound. On the other hand, when the electron accepting compound is an organic compound, for example, trinitrofluorenone may be mentioned as the electron accepting compound. Among them, Lewis acids such as molybdenum trioxide ($MoO_3$) or vanadium pentoxide ($V_2O_5$) are suitable.

The presence of the region, where the oxidizing dopant (electron accepting compound; the same shall apply hereinafter) has been mixed into the bipolar charge transport organic compound, at least at the interface between the electrode (anode 2 or cathode 5) and the hole injection/transport layer 3a or the electron injection/transport layer 3c suffices for contemplated results. The oxidizing dopant may be doped at a uniform concentration in the whole area in the thickness-wise direction of the transparent protective layer 4, or the oxidizing dopant may be doped so that the concentration of the oxidizing dopant in the transparent protective layer 4 is continuously increased from the organic layer 3 (hole injection/transport layer 3a or electron injection/transport layer 3c) side toward the electrode (anode 2 or cathode 5) side.

The concentration of the oxidizing dopant contained in the transparent protective layer 4 is not particularly limited. Preferably, the molar ratio between the bipolar charge transport organic compound and the oxidizing dopant is bipolar charge transport organic compound:oxidizing dopant=1:0.1 to 1:10. When the ratio of the oxidizing dopant is below the lower limit of the above-defined range, the concentration of the bipolar charge transport organic compound oxidized by the oxidizing dopant is so low that the doping effect (the effect of improving charge transfer properties; the same shall apply hereinafter) is sometimes unsatisfactory. When the ratio of the oxidizing dopant is above the above-defined range, the concentration of the oxidizing dopant in the bipolar charge transport organic compound is much higher than the concentration of the bipolar charge transport organic compound and, thus, the absolute value of the concentration of the bipolar charge transport organic compound oxidized by the oxidizing dopant is very low. As a result, as with the case where the concentration of the oxidizing dopant is low, the doping effect is sometimes unsatisfactory.

The method for transparent protective layer 4 formation is not particularly limited as long as the method does not affect the organic layer 3 including the luminescent layer or the like. Examples of such methods include chemical vapor deposition or physical vapor deposition such as vacuum vapor deposition, sputtering, and ion plating. Among them, chemical vapor deposition and vacuum vapor deposition are preferred. This is because, in the chemical vapor deposition and vacuum vapor deposition, the kinetic energy possessed by the gasified substance is so low that energy given to the organic layer 3 including the luminescent layer and the like is small.

A coating method may also be used as the method for transparent protective layer 4 formation. Further, when the transparent protective layer 4 is formed in a film form, a method may be adopted in which the film-like transparent protective layer 4 is stacked (transferred) onto the organic layer 3 either directly or through a pressure-sensitive adhesive.

In particular, vacuum vapor deposition is suitable as the method for transparent protective layer 4 formation. The vacuum vapor deposition has the above advantages and further has an additional advantage that any reactive gas such as oxygen is not introduced. Accordingly, preferably, also when chemical vapor deposition, sputtering, and ion plating are used, the reactive gas such as oxygen is not introduced and a nonreactive gas such as rare gas is introduced.

Vacuum vapor deposition methods include electric resistance heating vapor deposition, flush vapor deposition, arc vapor deposition, laser vapor deposition, high frequency heating vapor deposition, and electron beam vapor deposition. Among others, codeposition of the bipolar charge transport organic compound and the oxidizing dopant is preferred as the method for the formation of the transparent protective layer 4 doped with the oxidizing dopant. A conventional resistance heating method in which codeposition is performed using an oxidizing dopant having a relatively low saturated vapor pressure placed in a crucible, for example, ferric chloride or indium chloride may be mentioned as the codeposition method.

In the codeposition, for some materials, the vapor pressure is high even at room temperature, and the atmospheric pressure within the vacuum device cannot be kept at a predetermined degree of vacuum or less. In this case, a method may be adopted in which vapor pressure is regulated by regulating an orifice (opening size) such as a needle valve or a mass flow controller, or alternatively a method may be adopted in which an independently temperature controllable structure is adopted in the sample holding part to regulate the vapor pressure by cooling.

For example, a method in which the rate of deposition of the bipolar charge transport organic compound and the oxidizing dopant is continuously varied may be used as the method in which the oxidizing dopant is mixed into the bipolar charge transport organic compound so that the content of the oxidizing dopant is continuously increased from the organic layer 3 side toward the electrode (for example, cathode 5) side.

Preferably, the transparent protective layer 4 is transparent and has an average transmittance of not less than 10%, more preferably not less than 40%, in a visible light region (380 nm to 780 nm), whereby an organic EL element suitable for the top emission-type organic EL element can be provided. The average transmittance is a value measured with an ultraviolet visible light spectrophotometer (UV-2200A, manufactured by SHIMADZU CORPORATION) at room temperature in the air.

The thickness of the transparent protective layer 4 is not particularly limited as long as the transparent protective layer 4 is transparent to light, can relax impact in the formation of the electrode (anode 2 or cathode 5), and can satisfactorily exhibit the function of transporting charges to the hole injection/transport layer 3a or the electron injection/transport layer 3c. Specifically, the thickness may be in the range of approximately 10 nm to 200 nm, preferably in the range of 50 nm to 100 nm.

The transparent protective layer 4 described above is an inorganic transparent electroconductive film on which the anode 2 or the cathode 5 is formed by sputtering or the like. The transparent protective layer 4 is formed after the formation of the organic layer 3 (hole injection/transport layer 3a or electron injection/transport layer 3c) and before the formation of the anode 2 or the cathode 5. The inorganic transparent electroconductive film is generally formed by sputtering or the like, is dense, has a relatively high electroconductivity, and has relatively high transparency, and, thus, luminescence from the luminescent material-containing organic layer 3 can be efficiently taken out. The sputtering and the like, however, are a film formation method that is likely to cause damage including deteriorated characteristics to the organic compound constituting the organic layer 3. According to the present invention, the transparent protective layer 4 is formed after the formation of the organic layer 3 and before the formation of the anode 2 or the cathode 5 formed of the inorganic transparent electroconductive film on the organic layer 3. Accordingly, damage including deteriorated characteristics to the organic layer 3, for example, by sputtering which forms an inorganic transparent electroconductive film can be advantageously prevented. When the procedure of the formation is constructed as a method for manufacturing an organic EL element, the method is one for manufacturing an organic EL element comprising a luminescent material-containing organic layer 3 held between the anode 2 and the cathode 5 and a transparent protective layer 4 that contains a bipolar charge transport organic compound and an electron accepting compound and is provided between the anode 2 or the cathode 5 and the organic layer 3, wherein the anode 2 or the cathode 5 is formed of an inorganic transparent electroconductive film and the transparent protective layer 4 is formed after the formation of the organic layer 3 and before the formation of the inorganic transparent electroconductive film.

<Electroconductive Layer>

In the present invention, as shown in FIG. 2, preferably, an electroconductive layer 6 is provided between the organic layer 3 and the transparent protective layer 4. In the embodiment shown in FIG. 5, the electroconductive layer 6 is provided between the electron injection/transport layer 3c constituting the organic layer 3 and the transparent protective layer 4.

The electroconductive layer 6 contains a metal layer having a small work function and may have a single-layer structure of a metal layer or a multilayer structure of a plurality of layers including a metal layer. The metal layer may be formed of aluminum (Al), MgAg, or silver (Ag). The provision of the electroconductive layer 6 including a metal layer having a small work function between the transparent protective layer 4 and the organic layer 3 can realize efficient charge injection through the transparent protective layer 4 having good charge transfer properties into the organic layer 3 to which the damage has been minimized by the transparent protective layer 4. This construction can provide better current-voltage characteristics and luminescence characteristics.

In a more preferred embodiment of the electroconductive layer 6, as shown in FIG. 3, the electroconductive layer 6 comprises a first electroconductive layer 6a and a second electroconductive layer 6b (hereinafter referred to as "electroconductive layer 6'"). The first electroconductive layer 6a constituting the electroconductive layer 6' is preferably a metal layer having a small work function, and the second electroconductive layer 6b is preferably a layer containing at least a group 1 or 2 element of the periodic table. The first electroconductive layer 6a and the second electroconductive layer 6b are disposed so that the first electroconductive layer 6a is located on the organic layer 3 side.

The first electroconductive layer 6a formed of a metal layer having a small work function can advantageously efficiently inject charges into the organic layer 3. The second electroconductive layer 6b provided on the first electroconductive layer 6a can advantageously efficiently supply charges, supplied from the cathode 5 or the anode 2 through the transparent protective layer 4 having good charge transfer properties, into the first electroconductive layer 6a. Consequently, charges can be efficiently injected into the damage-free organic layer 3 through the transparent protective layer having good charge transfer properties, and better current-voltage characteristics and luminescence characteristics can be realized.

Materials for constituting the first electroconductive layer 6a include, for example, metals having a small work function such as aluminum (Al), cesium (Cs), or erbium (Er). Among them, aluminum (Al) is preferred. On the other hand, materials for constituting the second electroconductive layer 6b include, for example, metals, alloys, or compounds containing one or at least two group 1 or 2 elements of the periodic table, for example, MgAg, AlLi, AlMg, or CsTe. Among them, MgAg is preferred.

The thickness of the electroconductive layer 6 having a single-layer structure (see FIGS. 2 and 5) can be properly selected by taking into consideration the transmittance of the whole organic EL element. The thickness of the electroconductive layer 6 having the single-layer structure is generally 0.5 nm to 10 nm, preferably 1 nm to 5 nm. When the thickness of the electroconductive layer 6 is less than 0.5 nm, the luminescence start voltage is sometimes increased. On the other hand, when the thickness of the electroconductive layer 6 exceeds 10 nm, the transmittance is lowered and luminescence from the cathode side is lowered. More preferably, the thickness of the electroconductive layer 6 is 1 nm to 2 nm. The thickness of the electroconductive layer 6 in the above-defined range can advantageously realize improved electron injection characteristics and high transmittance.

The thickness of the electroconductive layer 6' comprising the first electroconductive layer 6a and the second electroconductive layer 6b (see FIGS. 3 and 6) can also be properly selected by taking into consideration particularly the influence of damage to the electroconductive layer 6' (particularly the second electroconductive layer 6b) by the oxidizing dopant contained in the transparent protective layer in the transparent protective layer formation. The first electroconductive layer 6a is preferably in a sea-island form. The thickness of the first electroconductive layer 6a is generally 0.5 nm to 5 nm, preferably 1 nm to 2 nm. On the other hand, the second electroconductive layer 6b preferably has a layered structure. The thickness of the second electroconductive layer 6b is generally 2 nm to 15 nm, preferably 5 nm to 10 nm.

When the thickness of the first electroconductive layer 6a is less than 0.5 nm, the sea-island spacing in the film formed as the first electroconductive layer 6a is increased, sometimes leading to the same luminescence state as in the embodiment where the second electroconductive layer 6b functions as the single electroconductive layer. When the thickness of the first electroconductive layer 6a is more than 10 nm, the state is sometimes changed from the sea-island state to the layered state and, consequently, the transmittance of the first electroconductive layer 6a is lowered, sometimes resulting in a lowered level of luminescence from the cathode side. When the thickness of the second electroconductive layer 6b is less than 2 nm, the first electroconductive layer 6a is brought to a sea-island state, sometimes leading to the same luminescence state as in the embodiment where the first electroconductive layer 6a functions as the single electroconductive layer. On the other hand, when the thickness of the second electroconductive layer 6b exceeds 15 nm, the transmittance of the second electroconductive layer 6b is lowered, sometimes resulting in a lowered level of luminescence from the cathode side. When the thickness of the first electroconductive layer 6a and the thickness of the second electroconductive layer 6b are in the above preferred thickness range, advantageously, the same transmittance as the electroconductive layer 6 can be realized and, at the same time, an improvement in electron injection characteristics and a reduction in the influence of the oxidizing dopant in the formation of the transparent protective layer can be realized.

The above electroconductive layers 6, 6' (first electroconductive layer 6a and second electroconductive layer 6b) may be formed by various methods. The formation of the electroconductive layers 6, 6' by physical vapor deposition is preferred, and the formation of the electroconductive layers 6, 6' by electric resistance heating vapor deposition is particularly preferred. Since the electroconductive layers 6, 6' are formed on the organic layer 3, the formation of the electroconductive layers 6, 6' by the electric resistance heating vapor deposition can reduce damage to the organic layer 3 (hole injection/transport layer 3a or electron injection/transport layer 3c) in the film formation. For example, the sea-island state of the 2 nm-thick electroconductive layer means that, although conditions are set so that a film having an estimated thickness of 2 nm can be formed in by the film forming method, the formed structure is in a sea-island form.

Thus, in the embodiments shown in FIGS. 2 and 3, electroconductive layers 6, 6' are formed on the organic layer 3 by a film forming method that does not cause damage to the organic layer 3, the transparent protective layer 4 is formed on the electroconductive layers 6, 6', and the electrode (anode 2 or cathode 5) is formed on the transparent protective layer 4, for example, by a conventional sputtering method. In this embodiment, by virtue of the function and effect of the transparent protective layer 4, the organic layer 3 does not undergo damage during the electrode formation. Further, since the transparent protective layer 4 has excellent properties of charge injection and charge transfer from the electrode, charges from the electrode can be supplied well into the electroconductive layers 6, 6' and, at the same time, the electroconductive layers 6, 6' can efficiently supplies the supplied charges into the organic layer 3. As a result, better current-voltage characteristics and luminescence characteristics can be realized.

Among others, the provision of the electroconductive layer 6' composed of the first electroconductive layer 6a and the second electroconductive layer 6b provided particularly preferred characteristics (see working examples which will be described later).

<Cathode>

The cathode 5 is an electrode that supplies electrons into the luminescence material-containing organic layer 3. Since the organic EL elements exemplified in FIGS. 1 to 3 are top emission-type light emitting elements in which light is taken out from the side (cathode 5 side) on which the layers are successively stacked, the cathode 5 should be transparent.

The material for constituting the cathode 5 is not particularly limited as long as the material is transparent and electroconductive. Examples thereof include transparent electroconductive oxides such as In—Sn—O (ITO), In—Zn—O. (IZO), Zn—O, Zn—O—Al, and Zn—Sn—O. Among them, a transparent electroconductive film formed of ITO or IZO is particularly preferred. The transparent electroconductive film formed of ITO or IZO has high electroconductivity and transparency to light and has low electrical resistivity, and, thus, the light takeout efficiency can be improved and the drive voltage of the organic layer 3 can be lowered.

The thickness of the cathode 5 is not particularly limited. When the transparent electroconductive film is used, however, the thickness of the cathode 5 is generally in the range of 10 nm to 500 nm, particularly preferably in the range of 50 nm to 300 nm. When the thickness is determined, the light transmittance should be taken into consideration. The thickness is determined so that the light transmittance in a visible light region of 380 nm to 780 nm is not less than 50%, preferably not less than 80%. When the thickness of the cathode 5 is less than 10 nm, the electroconductivity is unsatisfactory. On the other hand, when the thickness exceeds 500 nm, the light transmittance is unsatisfactory. Further, when the light emitting display device which has been assembled during or after the manufacture is deformed, defects such as cracking are likely to occur in the cathode 5 constituting the organic EL element. The light transmittance may be measured by the same method as in the measurement of the average transmittance of the transparent protective layer 4 and is a value measured with an ultraviolet visible light spectrophotometer (UV-2200A, manufactured by SHIMADZU CORPORATION) at room temperature in the air.

For example, chemical vapor deposition or physical vapor deposition such as vacuum vapor deposition, sputtering, and ion plating may be mentioned as the method for cathode 5 formation. In particular, sputtering or ion plating is preferred that is a high-energy film forming method which can form a dense film formed of a high-melting point material. Thus, in the present invention, since the transparent protective layer 4 is provided on the organic layer 3, a sputtering or ion plating method that can easily form a transparent electroconductive film which, by virtue of dense, relatively high electroconductivity and relatively high transparency properties, can efficiently take out luminescence from the luminescence material-containing organic layer 3, can be applied without posing a problem of damage to the organic layer 3.

<Other Construction>

After the formation of the cathode 5, if necessary, for example, a transparent base material may be provided through a sealing material. In this case, glass and film materials may be mentioned as the sealing material. Among the base materials 1, for example, highly transparent glass, polyether sulfone (PES) and polyethylene terephthalate (PET) are preferred used as the transparent base material.

As described above, according to the organic EL element of the present invention, the transparent protective layer has a high level of charge transfer properties due to the action of the electron accepting compound contained in the transparent protective layer on the bipolar charge transport organic compound. Accordingly, when an anode or a cathode is formed on the transparent protective layer, for example, by sputtering, the transparent protective layer can maintain a high level of charge transfer properties even upon exposure to impact of oxygen in the atmosphere, oxygen released from the target, and, further, sputter particles produced in the electrode formation, $Ar^+$ ions or ionization electrons and the like. Further, since the transparent protective layer is provided so as to cover the organic layer, the organic layer does not undergo damage including deteriorated characteristics. Accordingly, the organic layer does not undergo damage including deteriorated characteristics, and the transparent protective layer as well can maintain a high level of charge transfer properties. Thus, an organic EL element having excellent current-voltage characteristics and luminescence characteristics and free from a deterioration in luminescence characteristics (for example, lowered current density, lowered luminescence efficiency, or the occurrence of leak current) and can be provided.

Further, since the charge transport organic compound constituting the transparent protective layer has bipolar properties, charges (both holes and electrons) can be transferred. For example, when the organic layer has a construction of hole injection/transport layer—luminescent layer—electron injection/transport layer, the transparent protective layer can be formed on any of the hole injection/transport layer side and the electron injection/transport layer side. Further, as described above, organic EL elements can be provided that have excellent current-voltage characteristics and luminescence characteristics and do not undergo a deterioration in luminescence characteristics. This is very convenient from the viewpoints of characteristics and manufacture.

<Light Emitting Display Device>

The light emitting display device according to the present invention is characterized by comprising the organic EL element according to the present invention. As long as the light emitting display device comprises the organic EL element according to the present invention, the light emitting display device according to the present invention is not limited by the following form and currently known various constructions can be applied. In particular, a light emitting display device 20 comprising a thin-film transistor 21 for active drive of the organic EL element 10 is preferred.

Figure 7:
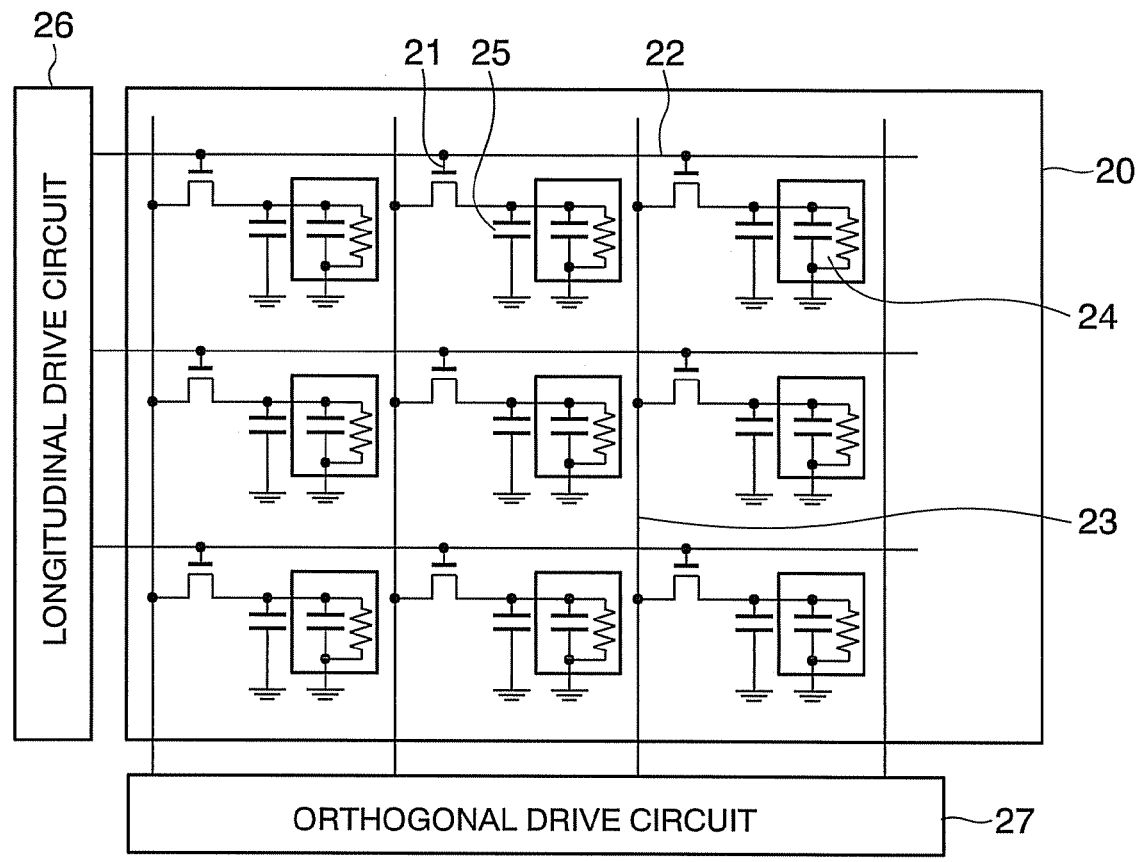
FIG. 7 is a typical cross-sectional view of one embodiment of the light emitting display device according to the present invention.

FIG. 7 is a schematic equivalent circuit diagram showing one embodiment of the light emitting display device according to the present invention. The light emitting display device 20 according to the present invention comprises a number of thin-film transistors 21 disposed in a matrix form, and gate bus lines 22 for a gate electrode and source bus lines 23 for a source electrode are extended in a matrix in a plane. An output element 24 is connected to a drain electrode in each thin-film transistor 21. The output element 24 is the organic EL element according to the present invention and is shown as an equivalent circuit comprising a resistor and a capacitor 25. Areas for respective output elements 24 constitute pixels of the light emitting display device. Numeral 26 designates a horizontal drive circuit, and numeral 27 designates a vertical drive circuit.

The thin-film transistor 21 may comprise at least a gate electrode, an insulating layer (including a gate insulating film), a semiconductor film, a source electrode, and a drain electrode. The structural form may be any of a bottom gate/top contact structure, a bottom gate/bottom contact structure, a top gate/top contact structure, and a top gate/bottom contact structure. The semiconductor film may be an organic semiconductor film or an inorganic semiconductor film.

Figure 8:
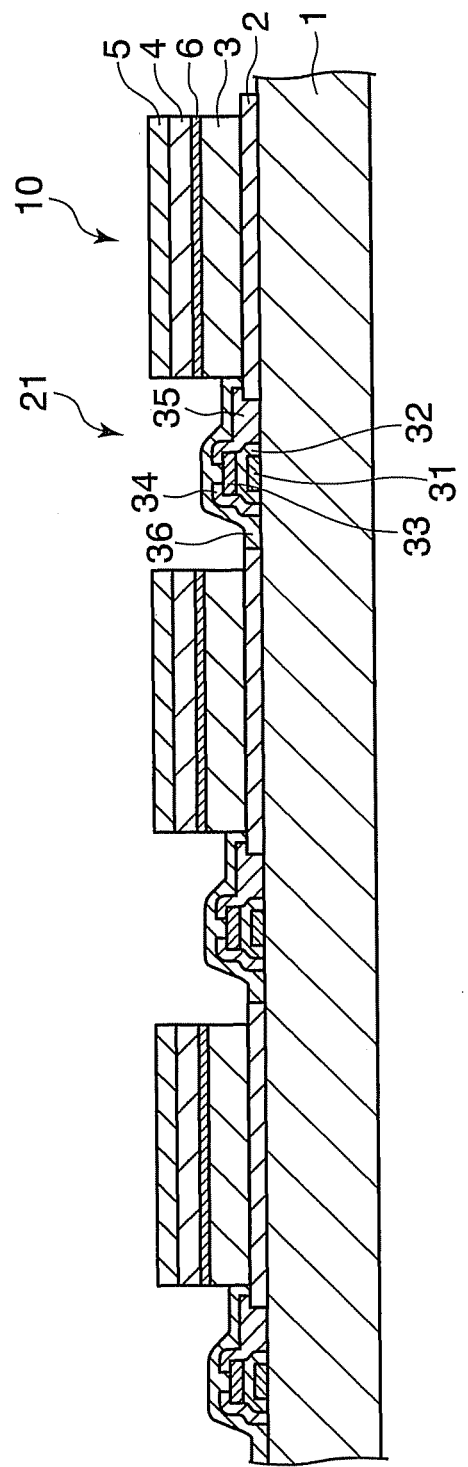
FIG. 8 is a typical cross-sectional view of another embodiment of the light emitting display device according to the present invention.

FIG. 8 is a typical cross-sectional view showing one embodiment of the light emitting display device according to the present invention. Specifically, FIG. 8 shows one embodiment of a light emitting display device 20 using the thin-film transistor 21 having a bottom gate/top contact structure as the active drive element in the organic EL element 10. The light emitting display device 20 shown in FIG. 8 comprises a base material 1 and an organic EL element 10 and a thin-film transistor 21, for the active drive of the organic EL element 10, provided on the base material 1. The thin-film transistor 21 shown in FIG. 8 is a bottom gate/top contact-type thin-film transistor comprising a gate electrode 31, a gate insulating film 32, a semiconductor film 33, a source electrode 34, a drain electrode 35, and a protective film 36. The organic EL element 10 comprises an anode 2, a luminescent material-containing organic layer 3, an electroconductive layer 6, a transparent protective layer 4, and a cathode 5 stacked in that order as viewed from a base material 1. The organic EL element 10 is configured so that the anode 2 is connected to the drain electrode 35 in the thin-film transistor 21, and the organic layer 3 in the organic EL element 10 emits light by active signals from the drain electrode 35. This embodiment is an example of the light emitting display device according to the present invention. In addition to this embodiment, various variants are possible.

As described above, according to the light emitting display device 20 of the present invention, even when a thin-film transistor 21 which is an active drive element is or is not provided, highly efficient light emitting display devices using an organic EL element having excellent current-voltage characteristics and luminescence characteristics can be provided.

EXAMPLES

The organic EL element according to the present invention will be described in more detail with reference to the following Examples and Comparative Examples.

Example 1

An ITO substrate was first provided. The ITO substrate had a 150 nm-thick line-patterned anode 2 of ITO (line width: 2 mm) provided on a transparent base material 1 formed of a glass substrate. TBADN represented by chemical formula 5 above and $MoO_3$ as an oxidizing dopant were codeposited on the ITO substrate at a deposition rate of 1.5 angstroms/sec under a degree of vacuum of 10-5 Pa so that the weight ratio of TBADN to $MoO_3$ was 67:33, thereby forming a 10 nm-thick hole injection layer.

TBADN represented by chemical formula 5 as described above was then vacuum-deposited on the hole injection layer at a deposition rate of 1.0 angstrom/sec under a degree of vacuum of 10-5 Pa to form a 10 nm-thick hole transport layer. The laminate composed of the hole injection layer and the hole transport layer can be said to be a hole injection/transport layer 3a having an oxidizing dopant-mixed region (hole injection layer) on the anode side.

TCTA represented by chemical formula 6 above as a host material and rubrene represented by chemical formula 8 below as a luminescent dopant to be a luminescence center were vacuum-deposited on the hole injection layer at a deposition rate of 1 angstrom/sec under a degree of vacuum of 10-5 Pa so that the concentration of rubrene was 1% by weight, thereby forming a 70 nm-thick luminescent layer 3b.

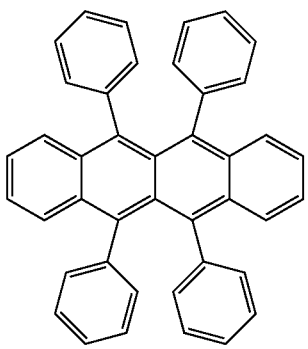 [SMILES: c1ccc(-c2c3ccccc3c(-c3ccccc3)c3c(-c4ccccc4)c4ccccc4c(-c4ccccc4)c23)cc1]

TBADN represented by chemical formula 5 above was then vacuum-deposited on the luminescent layer at a deposition rate of 1 angstrom/sec under a degree of vacuum of 10-5 Pa to form a 20 nm-thick electron transport layer.

TBADN represented by chemical formula 5 above and Liq as a reducing dopant represented by chemical formula 9 below were codeposited on the electron transport layer at a deposition rate of 1 angstrom/sec under a degree of vacuum of 10-5 Pa so that the weight ratio of TBADN to Liq was 1:1, thereby forming a 12 nm-thick electron injection layer. The laminate composed of the electron transport layer and the electron injection layer can be said to be an electron injection/transport layer 3c having a reducing dopant-mixed region (electron injection layer) on the cathode side. In the following description, when reference is made to the "electron injection layer," the electron injection layer, together with the electron transport layer, is referred to as "electron injection/transport layer 3c." The layers from the hole injection layer to the electron injection layer (electron injection/transport layer 3c) can be regarded as constituting an organic layer 3.

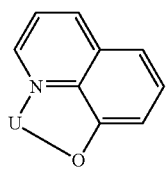

TBADN represented by chemical formula 5 above and MoO₃ as an oxidizing dopant were codeposited on the electron injection/transport layer 3c at a deposition rate of 1.5 angstroms/sec under a degree of vacuum of 10-5 Pa so that the weight ratio of TBADN to MoO₃ was 80:20, thereby forming a 10 nm-thick transparent protective layer 4.

Finally, a transparent electroconductive film of IZO was formed on the transparent protective layer by facing target sputtering to form a cathode 5 having a layer thickness of 150 nm. Thus, an organic EL element of Example 1 was prepared.

Comparative Example 1

An element of Comparative Example 1 was prepared in the same manner as in Example 1, except that the transparent protective layer 4 in the organic EL element of Example 1 was not formed, that is, the cathode was formed on the electron injection layer without forming the transparent protective layer 4.

Evaluation: Example 1 and Comparative Example 1

A direct current voltage of 15 V was applied across both the electrodes (anode and cathode) in the organic EL elements thus obtained. As a result, in the organic EL element of Example 1, rubrene-derived yellow luminescence was found. On the other hand, luminescence was not found in the element of Comparative Example 1.

The reason why the organic EL element of Example 1 emits light is considered as follows. That is, since the transparent protective layer 4 is a mixed layer composed of the bipolar charge transport organic compound (TBADN) and the electron accepting metal oxide (MoO₃), the interface between the electron injection/transport layer 3c and the cathode 5 is considered to function as a charge generating site or as a pseudo-electrode site having a large carrier density. When the interface functions as an electron injection site, it is considered that, upon the application of the voltage, charges in the transparent protective layer 4 are moved toward both the cathode and the anode (in the direction of the electron injection/transport layer 3c) and, consequently, the charges are moved to the luminescent layer 3b through the electron injection/transport layer 3c, leading to the observation of luminescence in the luminescent layer 3b. On the other hand, when the interface functions as the pseudo-electrode site, it is considered that, since charges can easily be moved at the interface, charges (electrons) injected from the cathode 5 are moved to the electron injection/transport layer 3c through the interface, leading to the observation of luminescence in the luminescent layer 3b.

The reason why the element of Comparative Example 1 does not emit light is considered to reside in that, even when the transparent electroconductive film of IZO is formed on the electron injection/transport layer by facing target sputtering regarded as a method that can form a film without causing damage, the electron injection layer has been changed, due to sputtering-derived damage, to such a state that the function as the electron injection layer has been lost.

Figure 9:
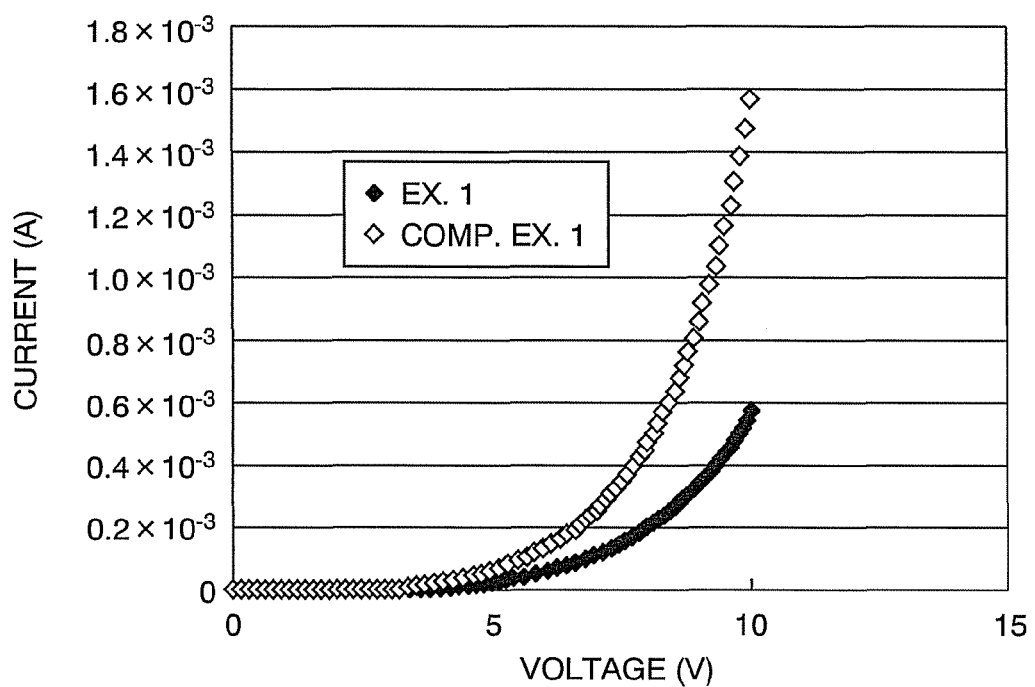
FIG. 9 is a graph showing current-voltage characteristics of the organic EL element of Example 1 and current-voltage characteristics of the organic EL element of Comparative Example 1.

FIG. 9 is a graph showing current-voltage characteristics of the organic EL element of Example 1 and current-voltage characteristics of the organic EL element of Comparative Example 1. The reason why the current value of the organic EL element of Comparative Example 1 which does not exhibit luminescence is higher than that of the organic EL element of Example 1 which exhibits luminescence is considered as follows. In the organic EL element of Comparative Example 1, damage to the organic layer 3 (particularly the electron injection/transport layer among the hole injection/transport layer 3a, the luminescent layer 3b, and the electron injection/transport layer 3c) in the formation of the cathode easily leads to passage of carriers between the hole transport layer and the electron transport layer and consequently is likely to cause leak current upon the application of voltage. It is considered that, for the above reason, as shown in FIG. 9, higher current values are obtained.

Example 2

An organic EL element of Example 2 was prepared in the same manner as in Example 1, except that, in the organic EL element of Example 1, an electroconductive layer 6 of aluminum (thickness 2 nm) was formed between the electron injection/transport layer 3c and the transparent protective layer 4 at a deposition rate of 0.5 angstrom/sec under a degree of vacuum of 10-5 Pa. The organic EL element of Example 2 was observed under a scanning electron microscope. As a result, the formed 2 nm-thick Al was in an sea-island form.

Comparative Example 2

An organic EL element of Comparative Example 2 was prepared in the same manner as in Comparative Example 1, except that, in the organic EL element of Comparative Example 1, an electroconductive layer 6 of aluminum (thickness 2 nm) was formed between the electron injection/transport layer 3c and the cathode 5 at a deposition rate of 0.5 angstrom/sec under a degree of vacuum of 10-5 Pa.

Evaluation: Example 2 and Comparative Example 2

Figure 10:
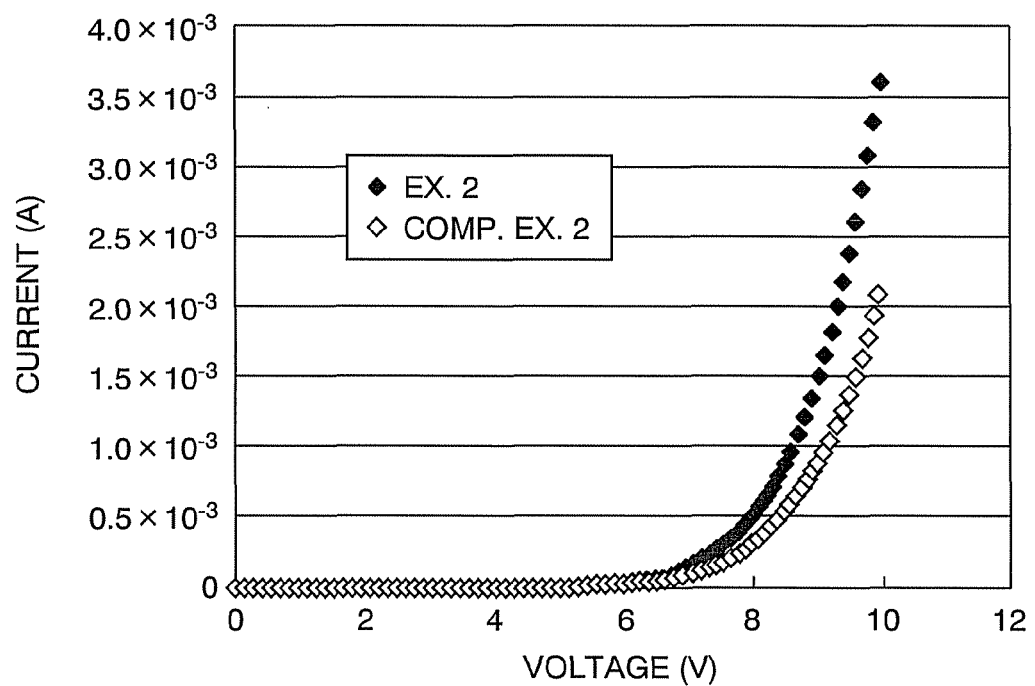
FIG. 10 is a graph showing current-voltage characteristics of the organic EL element of Example 2 and current-voltage characteristics of the organic EL element of Comparative Example 2.

FIG. 10 is a graph showing current-voltage characteristics of the organic EL element of Example 2 and current-voltage characteristics of the organic EL element of Comparative Example 2. The organic EL element of Example 2 exhibited a significant improvement in current characteristics over the organic EL element of Example 1 and emitted light as in the organic EL element of Example 1. On the other hand, the organic EL element of Comparative Example 2 exhibited suppressed leak current as compared with the organic EL element of Comparative Example 1 and, unlike the organic EL element of Comparative Example 1, emitted light. The reason why the organic EL element of Comparative Example 2 emitted light is that damage to the organic layer 3 in the cathode formation was reduced by the provision of the electroconductive layer 6. Since, however, the transparent protective layer 4 as provided in the organic EL element of Example 2 was not provided in the organic EL element of Comparative Example 2, the current characteristics of the organic EL element of Comparative Example 2 were inferior to those of the organic EL element of Example 2.

The organic EL element of Example 2 exhibited much higher current values than the organic EL element of Example 1. The reason for this can be said to reside in that the electroconductive layer 6 was provided between the electron injection/transport layer 3c and the transparent protective layer 4. As with the organic EL element of Example 1, for the organic EL element of Example 2, it is considered that the provision of the transparent protective layer 4 could prevent damage to the organic layer 3 in the cathode formation and the provision of the electroconductive layer 6 could improve characteristics of electron injection into the electron injection/transport layer 3c over the characteristics of electron injection of the organic EL element of Example 1. The improvement in electron injection characteristics would be attributable to the formation of a complex, which assists in the charge transfer to the electron injection/transport layer 3c by the electroconductive layer 6 or the formation of energy level by the electroconductive layer 6.

Example 3

An organic EL element of Example 3 was prepared in the same manner as in Example 1, except that, in the organic EL element of Example 1, an electroconductive layer 6' was provided between the electron injection/transport layer 3c and the transparent protective layer 4 by forming a first electroconductive layer 6a of Al (thickness 2 nm) from the electron injection/transport layer 3c side at a deposition rate of 0.5 angstrom/sec under a degree of vacuum of 10-5 Pa and further forming a second electroconductive layer 6b of MgAg (thickness 5 nm) on the first electroconductive layer 6a at a deposition rate of 1 angstrom/sec under a degree of vacuum of 10-5 Pa.

Comparative Example 3

An organic EL element of Comparative Example 3 was prepared in the same manner as in Comparative Example 1, except that, in the organic EL element of Comparative Example 1, an electroconductive layer 6' was provided between the electron injection/transport layer 3c and the transparent protective layer 4 by forming a first electroconductive layer 6a of Al (thickness 2 nm) from the electron injection/transport layer 3c side at a deposition rate of 0.5 angstrom/sec under a degree of vacuum of 10-5 Pa and further forming a second electroconductive layer 6b of MgAg (thickness 5 nm) on the first electroconductive layer 6a at a deposition rate of 1 angstrom/sec under a degree of vacuum of 10-5 Pa.

Evaluation: Example 3 and Comparative Example 3

Figure 11:
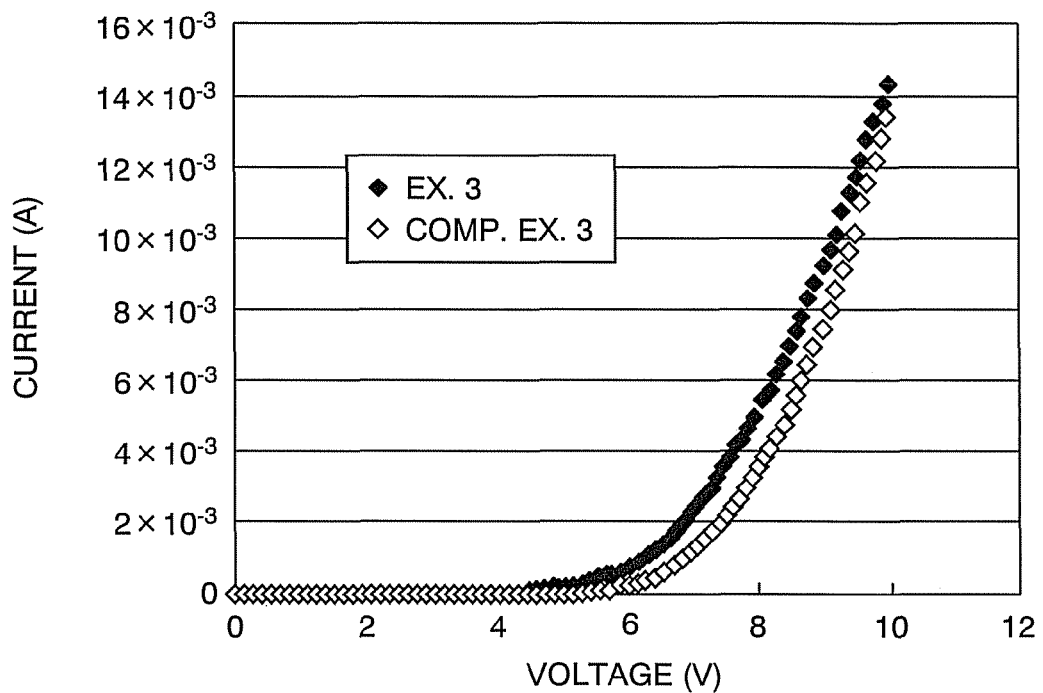
FIG. 11 is a graph showing current-voltage characteristics of the organic EL element of Example 3 and current-voltage characteristic of the organic EL element of Comparative Example 3.
Figure 12:
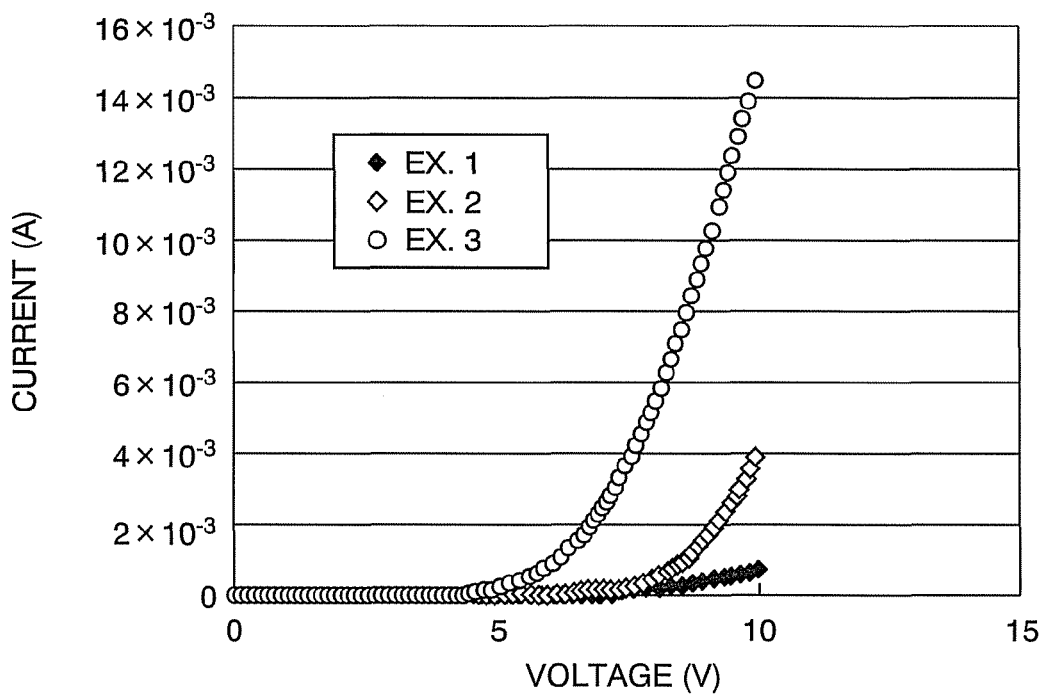
FIG. 12 is a graph showing current-voltage characteristics of the organic EL elements of Examples 1 to 3.
Figure 13:
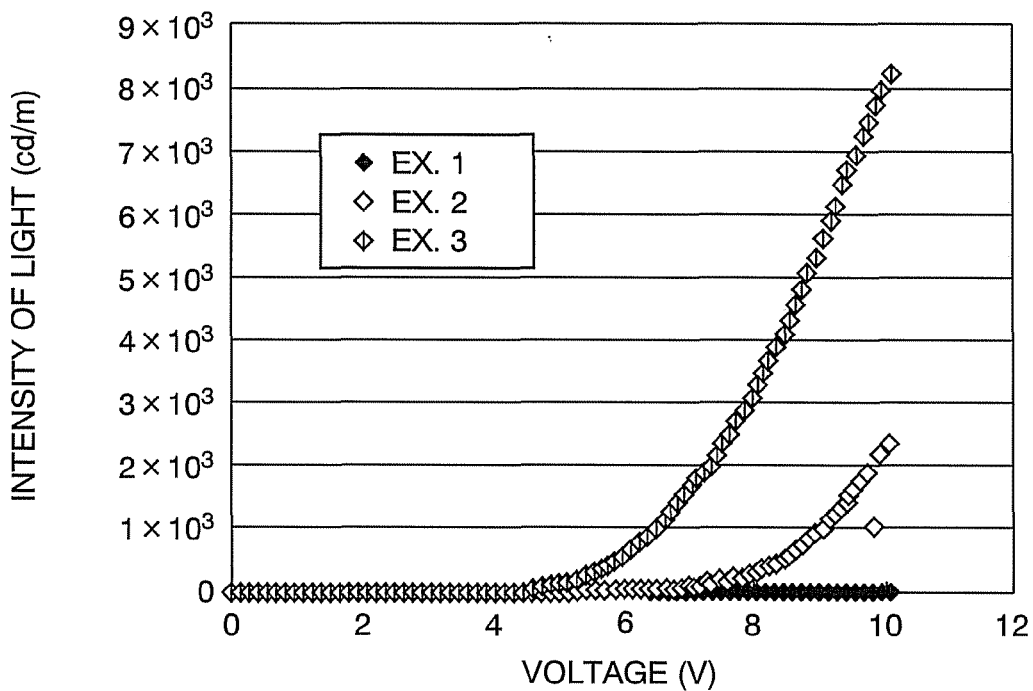
FIG. 13 is a graph showing brightness-voltage characteristics of the organic EL elements of Examples 1 to 3.

FIG. 11 is a graph showing current-voltage characteristics of the organic EL element of Example 3 and current-voltage characteristics of the organic EL element of Comparative Example 3. The organic EL element of Example 3 exhibited a significant improvement in current characteristics over the organic EL element of Example 2 and emitted light as in the organic EL element of Example 1. The organic EL element of Comparative Example 3 also exhibited a significant improvement in current characteristics over the organic EL element of Comparative Example 2 and emitted light as in the organic EL element of Comparative Example 2. The reason for this is that the provision of the electroconductive layer 6b further reduced damage to the organic layer 3 in the cathode formation. FIG. 12 is a graph showing current-voltage characteristics of the organic EL elements of Examples 1 to 3, and FIG. 13 is a graph showing brightness-voltage characteristics of the organic EL elements of Examples 1 to 3.

The organic EL element of Example 3 exhibited much higher current values and much higher brightness than the organic EL element of Example 2. The reason for this can be said to reside in the provision of the electroconductive layer 6' between the electron injection/transport layer 3c and the transparent protective layer 4. Also, for the organic EL element of Example 3, it is considered that, as with the organic EL elements of Examples 1 and 2, the provision of the transparent protective layer 4 could prevent damage to the organic layer 3 in the cathode formation and, at the same time, unlike Examples 1 and 2, the provision of the electroconductive layer 6' constituted by the first electroconductive layer 6a and the second electroconductive layer 6b has contributed to a significant improvement of characteristics of injection of electrons into the electron injection/transport layer 3c over the electron injection characteristics of Examples 1 and 2. The significant improvement in electron injection characteristics would be attributable to an enhancement in the effect of assisting the transfer of charges to the electron injection/transport layer 3c by the provision of the electroconductive layer 6' as compared with the organic EL element of Example 2.

Example 4

An organic EL element of Example 4 was prepared in the same film formation conditions as in Example 1, except that, in the organic EL element of Example 1, $V_2O_5$ was used instead of $MoO_3$ which was an oxidizing dopant for transparent protective layer 4 formation.

Evaluation: Example 4

Also for Example 4, as with Example 1, the transfer of charges to the electron injection/transport layer 3c could be confirmed. It is considered that, as with Example 1, the transparent protective layer 4 in Example 4 is also formed of a mixed layer composed of the bipolar organic compound and the electron accepting metal oxide and thus has a charge generating function and a pseudo-electrode function.

Example 5

An organic EL element of Example 5 was prepared under the same film formation conditions as in Example 1, except that, in the organic EL element of Example 1, CBP of chemical formula 1 was used instead of TBADN of chemical formula 5 which was the bipolar charge transport organic compound for transparent protective layer 4 formation.

Evaluation: Example 5 and Comparative Example 1

Figure 14:
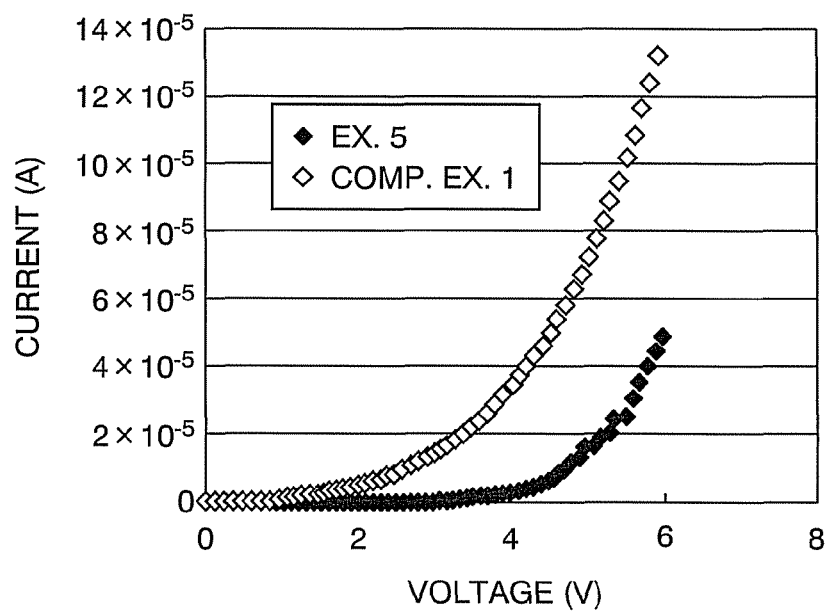
FIG. 14 is a graph showing current-voltage characteristics of the organic EL element of Example 5 and current-voltage characteristics of the organic EL element of Comparative Example 1.

Also for Example 5, as with Example 1, the transfer of charges to the electron injection/transport layer 3c could be confirmed. It is considered that, as with Example 1, the transparent protective layer 4 in Example 5 is also formed of a mixed layer composed of the bipolar organic compound and the electron accepting metal oxide and thus has a charge generating function and a pseudo-electrode function. FIG. 14 is a graph showing current-voltage characteristics of the organic EL element of the Example 5 and current-voltage characteristics of the organic EL element of Comparative Example 1. As can be seen from FIG. 14, as with Example 1, Example 5 had lower current values than Comparative Example 1. It is considered that the lower current values in Example 5 demonstrate the suppression of damage to the organic layer 3 (particularly the electron injection/transport layer 3c among the hole injection/transport layer 3a, the luminescent layer 3b, and the electron injection/transport layer 3c) in the cathode formation and, thus, the same transparent protective layer as in Example 1 is formed.

Example 6

An organic EL element of Example 6 was prepared under the same film formation conditions as in Example 1, except that, in the organic EL element of Example 1, DBzA of chemical formula 7 was used instead of TBADN of chemical formula 5 which was the bipolar charge transport organic compound for transparent protective layer 4 formation.

Evaluation: Example 6

Also for Example 6, as with Example 1, the transfer of charges to the electron injection/transport layer 3c could be confirmed. It is considered that, as with Example 1, the transparent protective layer 4 in Example 6 is also formed of a mixed layer composed of the bipolar organic compound and the electron accepting metal oxide and thus has a charge generating function and a pseudo-electrode function. FIG. 15 is a graph showing current-voltage characteristics of the organic EL element of the Example 6 and current-voltage characteristics of the organic EL element of Comparative Example 1. As can be seen from FIG. 15, as with Example 1, Example 6 had lower current values than Comparative Example 1. It is considered that the lower current values in Example 6 demonstrate the suppression of damage to the organic layer 3 (particularly the electron injection/transport layer 3c among the hole injection/transport layer 3a, the luminescent layer 3b, and the electron injection/transport layer 3c) in the cathode formation and, thus, the same transparent protective layer as in Example 1 is formed.

Example 7

A light emitting display device was prepared using the organic EL element of Example 3. In the preparation of the light emitting display device, a TFT substrate prepared by forming a thin-film transistor and then patterning a metal film as a wiring layer (an anode) was first provided. Elements, from the hole injection/transport layer 3a to the cathode 5, constituting the organic EL element of Example 3 were successively formed on the wiring layer of the TFT substrate to prepare a light emitting display device of Example 7.

Evaluation: Example 7

FIG. 16 is a graph showing current density-voltage characteristics of the light emitting display device of Example 7 together with current density-voltage characteristics of the organic EL element of Example 3. As can be seen from the current density-voltage characteristics shown in FIG. 16, the light emitting display device of Example 5 exhibited good characteristics and exhibited rubrene-derived yellow luminescence. Further, as can be seen from FIG. 16, the current density-voltage characteristics observed in the light emitting display device of Example 7 are equivalent to those in the organic EL element of Example 3, demonstrating that the provision of the transparent protective layer has suppressed a deterioration in current characteristics caused by damage in the formation of the cathode (transparent electroconductive film formed by sputtering).

What is claimed is:

1. An organic electroluminescent element comprising: an anode; a cathode; and an organic layer held between the anode and the cathode, the organic layer containing a luminescent material,
    the organic electroluminescent element further comprising (i) a transparent protective layer provided between the anode or the cathode and the organic layer, the transparent protective layer containing a bipolar charge transport organic compound and an electron-accepting compound, and (ii) an electroconductive layer provided between the transparent protective layer and the organic layer, the electroconductive layer including a metal layer having a small work function.

2. The organic electroluminescent element according to claim 1, wherein the electron-accepting compound is molybdenum trioxide or vanadium pentoxide.

3. The organic electroluminescent element according to claim 1, wherein the electroconductive layer comprises a first electroconductive layer that is a metal layer having a small work function, and a second electroconductive layer comprising at least a group 1 or 2 element of the periodic table, the first electroconductive layer being provided on the organic layer side.

4. The organic electroluminescent element according to claim 3, wherein the first electroconductive layer is a thin film of aluminum having a sea-island structure and the second electroconductive layer is a layered thin film of MgAg.

5. The organic electroluminescent element according to claim 1, wherein the bipolar charge transport organic compound is one or at least two compounds selected from the group consisting of CBP, Spiro-CBP, CzTT, m-CP, TBADN, and derivatives thereof.

6. A light emitting display device comprising an organic electroluminescent element according to claim 1.

7. The light emitting display device according to claim 6, which further comprises a thin-film transistor that drives the organic electroluminescent element by active driving.

8. A method for manufacturing an organic electroluminescent element comprising (i) a luminescent material-containing organic layer held between an anode and a cathode, (ii) a transparent protective layer provided between the anode or the cathode and the organic layer, the transparent protective layer containing a bipolar charge transport organic compound and an electron-accepting compound and (iii) an electroconductive layer provided between the transparent protective layer and the organic layer, the electroconductive layer including a metal layer having a small work function, the method comprising forming the transparent protective layer in a period of time between after the formation of the organic layer and the electroconductive layer and before the formation of the anode or the cathode on the organic layer, the anode or the cathode being formed of an inorganic transparent electroconductive film.

* * * * *